US011545402B2

(12) United States Patent
Harashima et al.

(10) Patent No.: US 11,545,402 B2
(45) Date of Patent: Jan. 3, 2023

(54) SEMICONDUCTOR WAFER, SEMICONDUCTOR CHIP, AND DICING METHOD

(71) Applicant: Kioxia Corporation, Tokyo (JP)

(72) Inventors: Hiromitsu Harashima, Yokohama (JP); Yasushi Kameda, Hayama (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/113,455

(22) Filed: Dec. 7, 2020

(65) Prior Publication Data

US 2021/0375704 A1     Dec. 2, 2021

(30) Foreign Application Priority Data

May 28, 2020 (JP) .............................. JP2020-093643

(51) Int. Cl.
| | | |
|---|---|---|
| *H01L 27/146* | (2006.01) | |
| *H01L 23/544* | (2006.01) | |
| *H01L 21/66* | (2006.01) | |
| *H01L 21/78* | (2006.01) | |
| *G01R 31/28* | (2006.01) | |
| *H01L 27/11582* | (2017.01) | |
| *H01L 27/11565* | (2017.01) | |

(52) U.S. Cl.
CPC .......... *H01L 22/34* (2013.01); *G01R 31/2884* (2013.01); *H01L 21/78* (2013.01); *H01L 27/11582* (2013.01); *H01L 27/11565* (2013.01)

(58) Field of Classification Search
CPC ............... H01L 22/34; H01L 27/11573; H01L 27/11582; H01L 27/1157
See application file for complete search history.

(56) References Cited

U.S. PATENT DOCUMENTS

| | | |
|---|---|---|
| 9,190,499 B2 | 11/2015 | Hirai et al. |
| 10,522,460 B2 | 12/2019 | Ichinose et al. |
| 2015/0179673 A1 | 6/2015 | Yamamoto et al. |
| 2018/0240832 A1* | 8/2018 | Iwafuchi ................ H04N 5/369 |
| 2019/0057973 A1 | 2/2019 | Terada et al. |
| 2019/0088493 A1* | 3/2019 | Watanabe ......... H01L 21/30608 |
| 2019/0164910 A1* | 5/2019 | Roh ..................... H01L 23/544 |
| 2019/0221535 A1 | 7/2019 | Shin et al. |

(Continued)

FOREIGN PATENT DOCUMENTS

JP     2019-54162 A     4/2019

*Primary Examiner* — Bradley Smith
*Assistant Examiner* — David J Goodwin
(74) *Attorney, Agent, or Firm* — Oblon, McClelland, Maier & Neustadt, L.L.P.

(57) ABSTRACT

A semiconductor wafer according to the present embodiment is a semiconductor wafer having a first face. A plurality of chip structures are provided on a plurality of chip regions of the first face. A test structure is provided on dicing regions between adjacent ones of the chip regions. The chip structures each comprise first integrated circuits provided on the semiconductor wafer, and a first stacked body provided above the first integrated circuits and including a plurality of first layers and a plurality of second layers different from the first layers alternately stacked. The test structure comprises second integrated circuits provided on the semiconductor wafer, and a second stacked body provided above the second integrated circuits and including the first layers and the second layers alternately stacked.

11 Claims, 25 Drawing Sheets

(56) References Cited

U.S. PATENT DOCUMENTS

| | | |
|---|---|---|
| 2019/0326311 A1 | 10/2019 | Chakihara |
| 2020/0303268 A1* | 9/2020 | Kim ...................... H01L 23/585 |
| 2021/0134685 A1* | 5/2021 | Chen ...................... H01L 24/03 |
| 2021/0175133 A1* | 6/2021 | Choi ..................... H01L 23/585 |
| 2021/0280466 A1* | 9/2021 | Fujii ..................... H01L 23/562 |

* cited by examiner

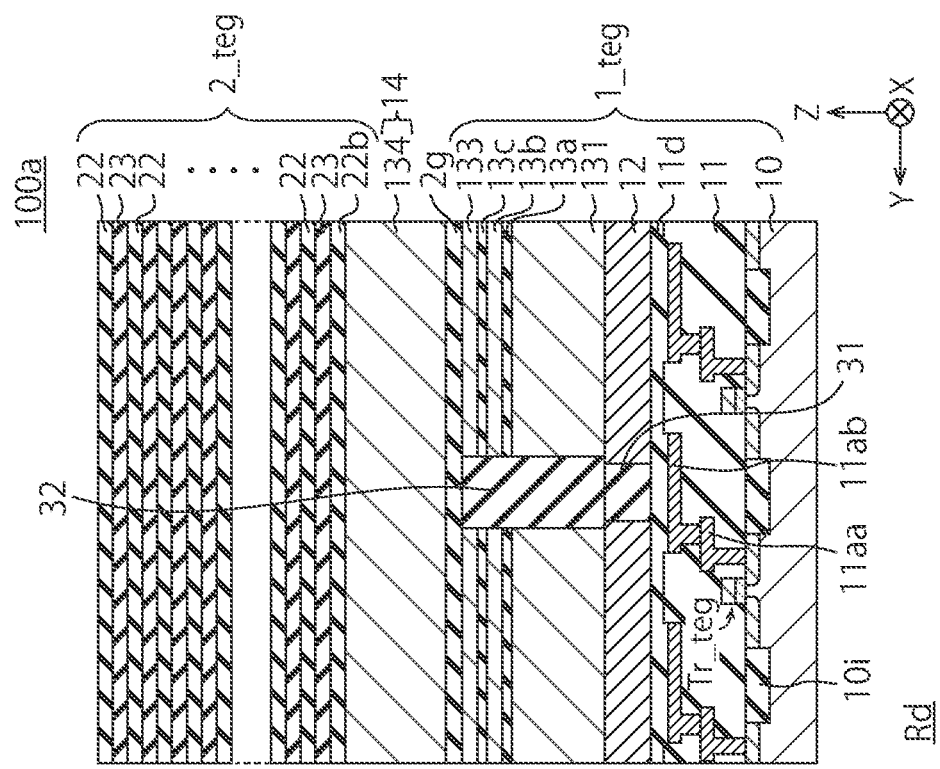
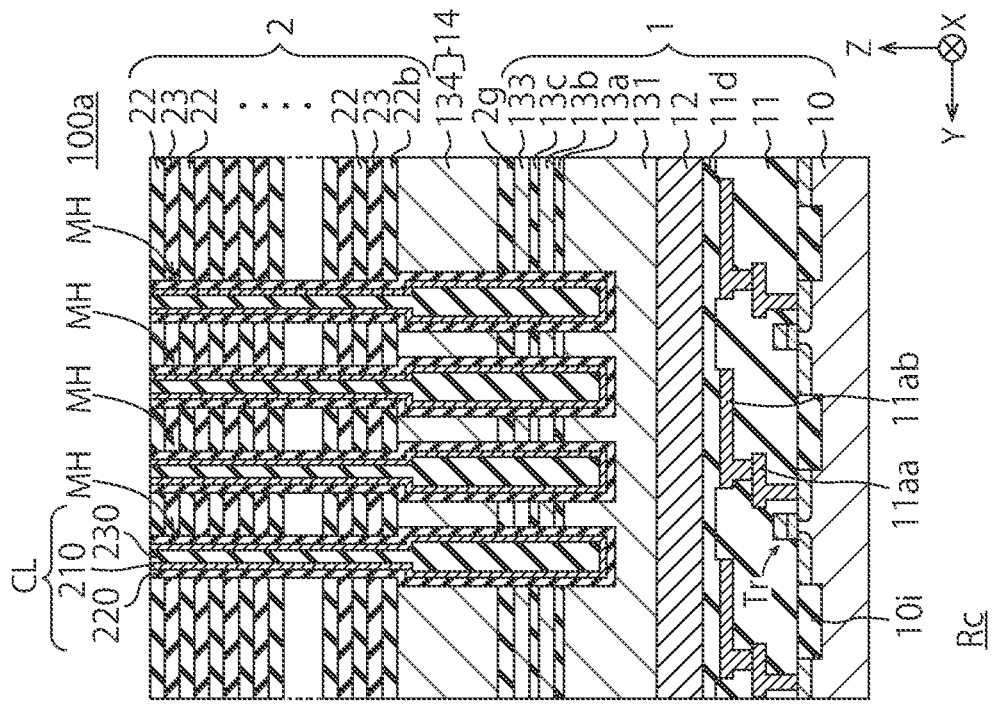
FIG. 13A
FIG. 13B

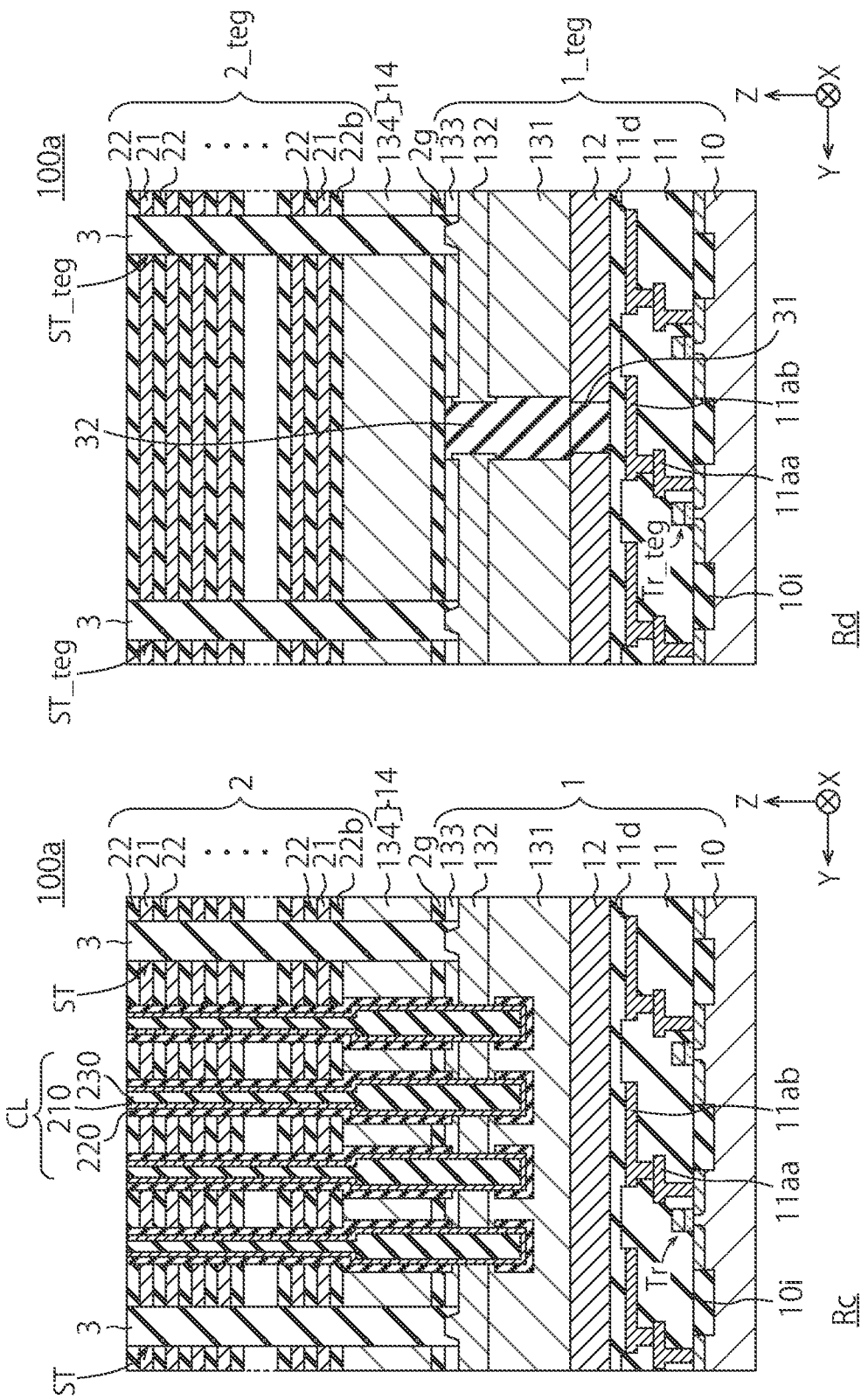

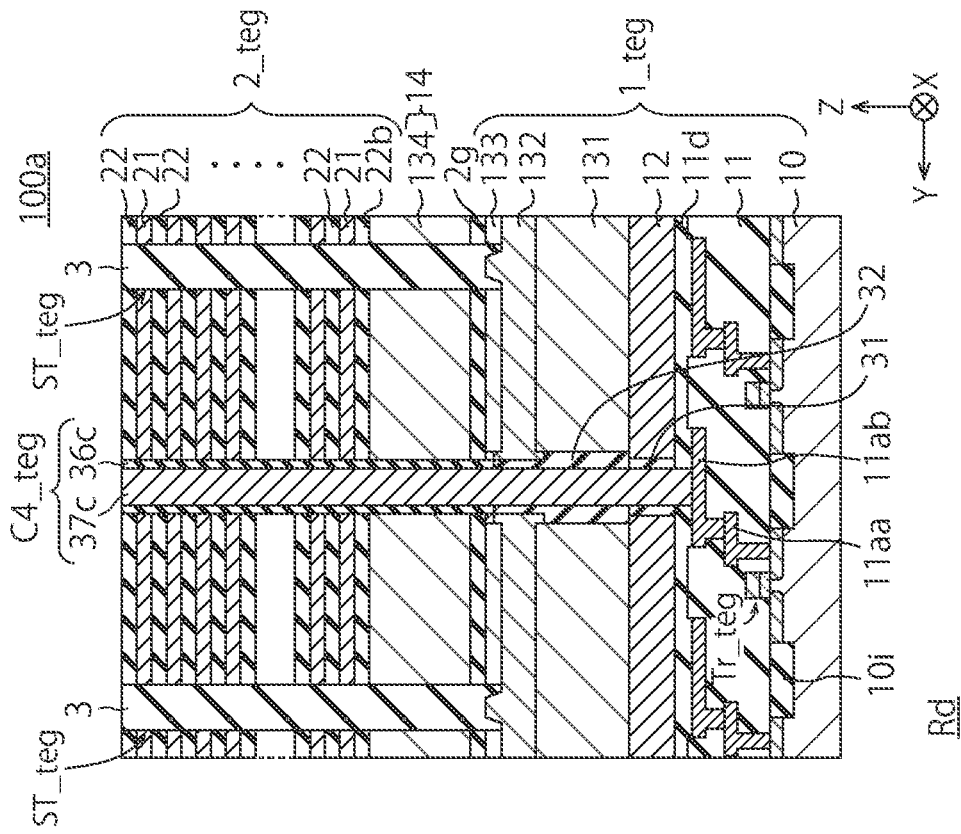
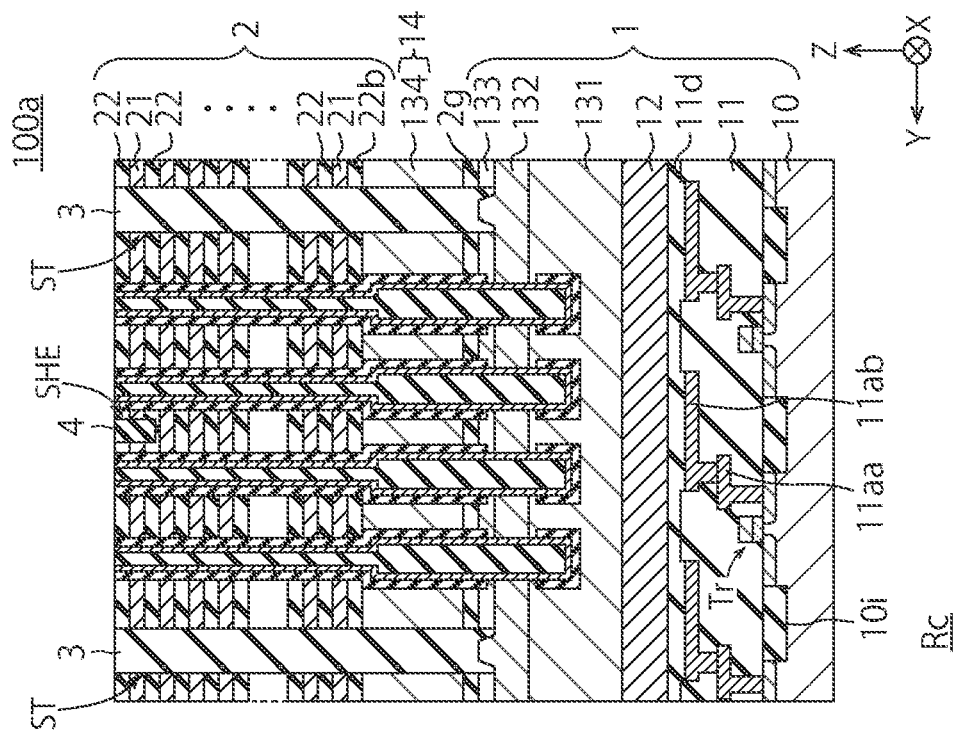
FIG. 20A
FIG. 20B

SEMICONDUCTOR WAFER, SEMICONDUCTOR CHIP, AND DICING METHOD

CROSS REFERENCE TO RELATED APPLICATIONS

This application is based upon and claims the benefit of priority from the prior Japanese Patent Application No. 2020-093643, filed on May 28, 2020, the entire contents of which are incorporated herein by reference.

FIELD

The embodiments of the present invention relate to a semiconductor wafer, a semiconductor chip, and a dicing method.

BACKGROUND

Semiconductor storage devices such as a NAND flash memory having a three-dimensional memory cell array in which memory cells are three-dimensionally arrayed are developed. In these semiconductor storage devices, a CMOS (Complementary Metal Oxide Semiconductor) circuit is sometimes provided below the memory cell array.

However, it is difficult to detect the effect of the memory cell array on the CMOS circuit located therebelow in the conventional semiconductor storage devices.

BRIEF DESCRIPTION OF THE DRAWINGS

FIGS. 9A to 20B are sectional views illustrating an example of the manufacturing method of the semiconductor wafer according to the first embodiment;

DETAILED DESCRIPTION

Figure 1:
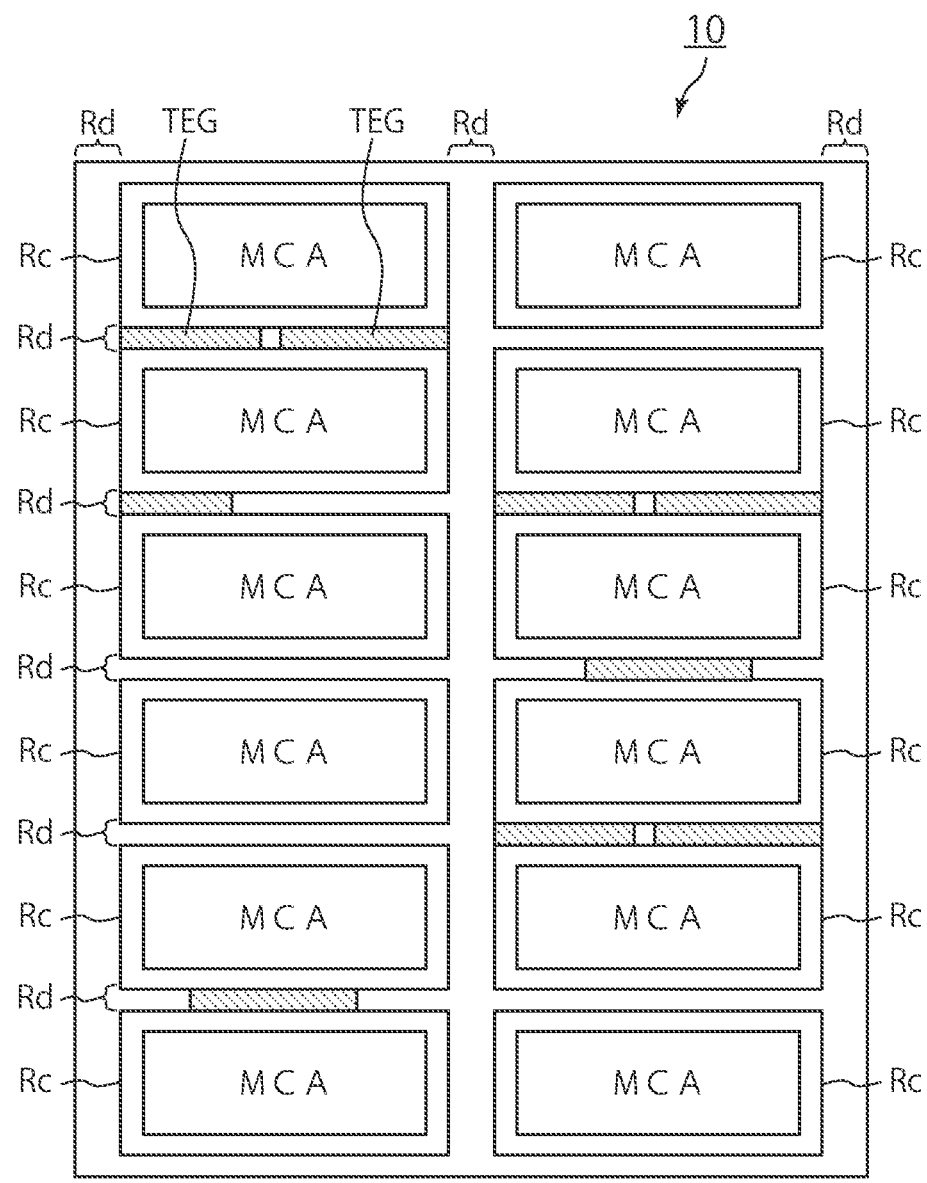
FIG. 1 is a plan view illustrating a configuration example of a part of a semiconductor wafer according to a first embodiment.

Embodiments will now be explained with reference to the accompanying drawings. The present invention is not limited to the embodiments. In the embodiments, "an upper direction" or "a lower direction" refers to a relative direction when a direction perpendicular to a surface of a semiconductor substrate on which semiconductor elements are provided is assumed as "an upper direction". Therefore, the term "upper direction" or "lower direction" occasionally differs from an upper direction or a lower direction based on a gravitational acceleration direction. In the present specification and the drawings, elements identical to those described in the foregoing drawings are denoted by like reference characters and detailed explanations thereof are omitted as appropriate.

A semiconductor wafer according to the present embodiment is a semiconductor wafer having a first face. A plurality of chip structures are provided on a plurality of chip regions of the first face. A test structure is provided on dicing regions between adjacent ones of the chip regions. The chip structures each comprise first integrated circuits provided on the semiconductor wafer, and a first stacked body provided above the first integrated circuits and including a plurality of first layers and a plurality of second layers different from the first layers alternately stacked. The test structure comprises second integrated circuits provided on the semiconductor wafer, and a second stacked body provided above the second integrated circuits and including the first layers and the second layers alternately stacked.

First Embodiment

FIG. 1 is a plan view illustrating a configuration example of a part of a semiconductor wafer 10 according to a first embodiment. The semiconductor wafer 10 is a substrate having a front surface as a first face on which semiconductor elements are formed, and a back surface on the opposite side to the front surface. FIG. 1 is a plan view illustrating the front surface of the semiconductor wafer 10.

The semiconductor wafer 10 includes a plurality of chip regions Rc and a plurality of dicing regions Rd on the front surface. The chip regions Rc are regions of semiconductor chips, which will be respectively singulated into semiconductor chips in a later dicing process. A chip pattern as a chip structure is provided in each of the chip regions Rc. In the present embodiment, the chip pattern includes, for example, a memory cell array MCA. A control circuit that controls the memory cell arrays MCA is provided below the memory cell array MCA and is not illustrated in FIG. 1.

The dicing regions Rd are provided between the chip regions Rc adjacent to each other and are cut (removed) to singulate the chip regions Rc in the later dicing process. A test pattern TEG as a test structure is provided in each of the dicing regions Rd.

Figure 2:
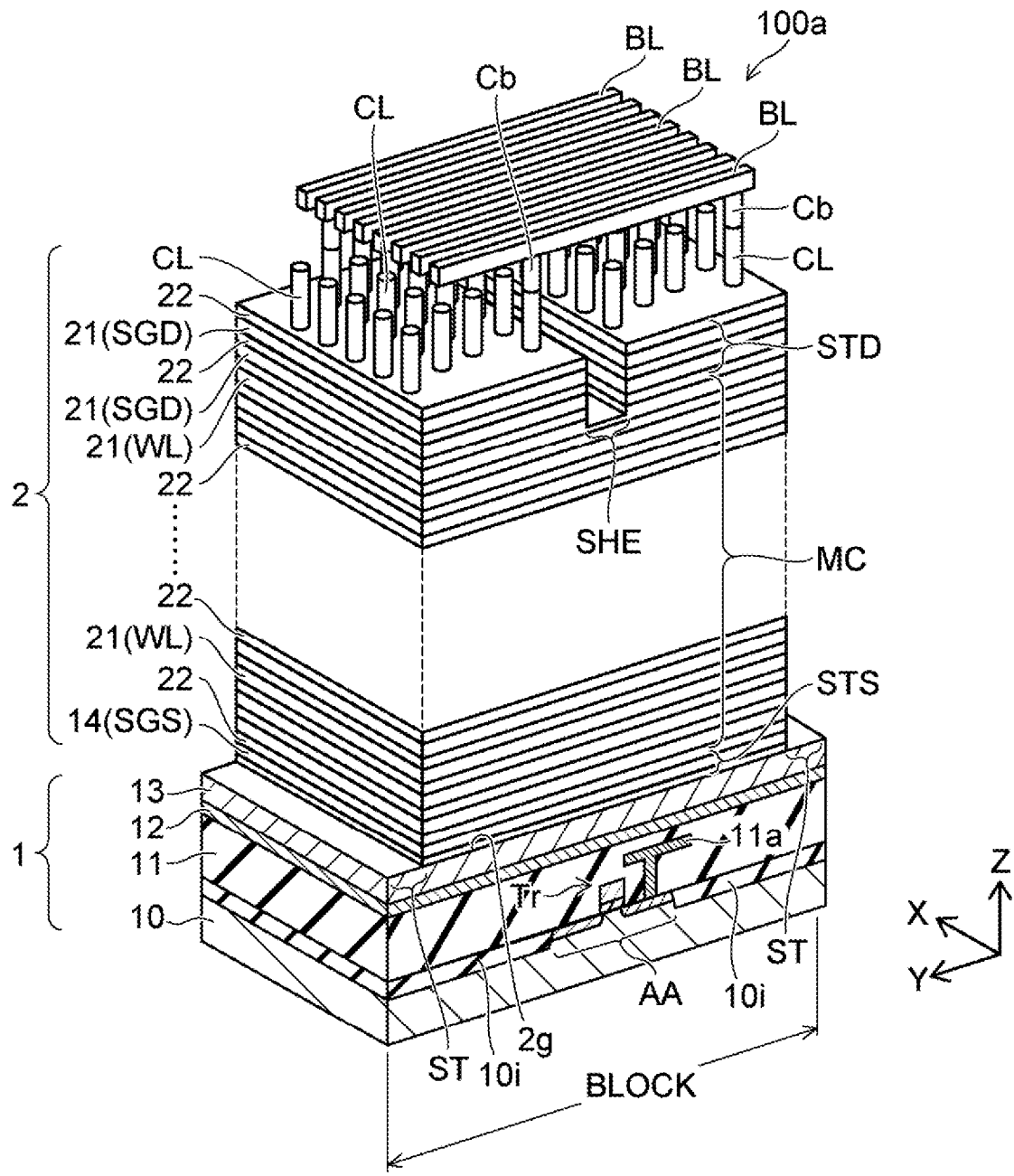
FIG. 2 is a perspective view illustrating an example of a semiconductor device according to the first embodiment.
Figure 3:
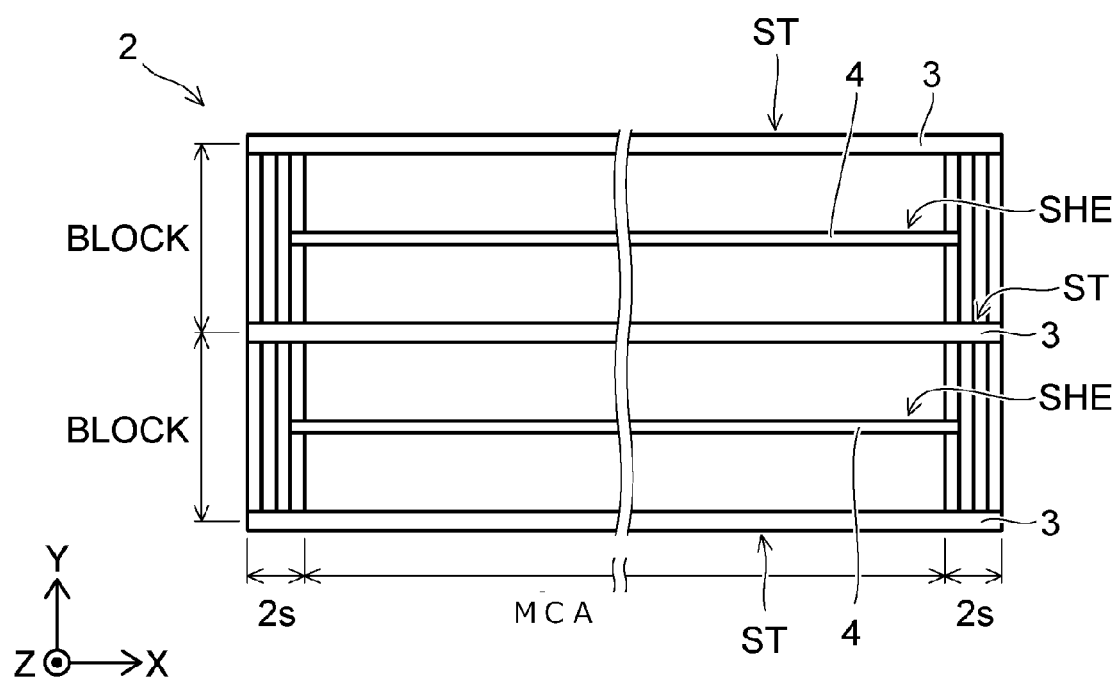
FIG. 3 is a plan view illustrating a stacked body.
Figure 4:
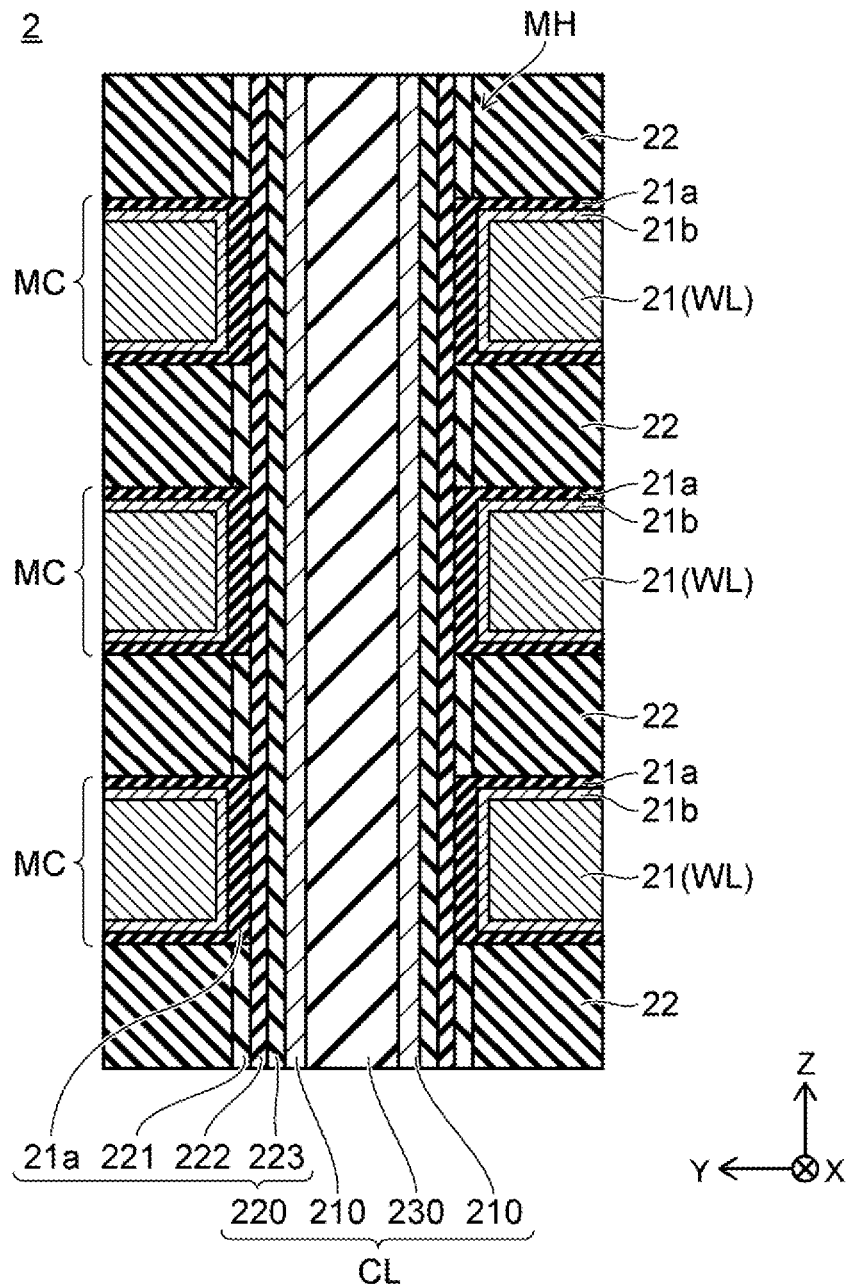
FIGS. 4 and 5 are sectional views illustrating an example of memory cells with a three-dimensional structure.
Figure 5:
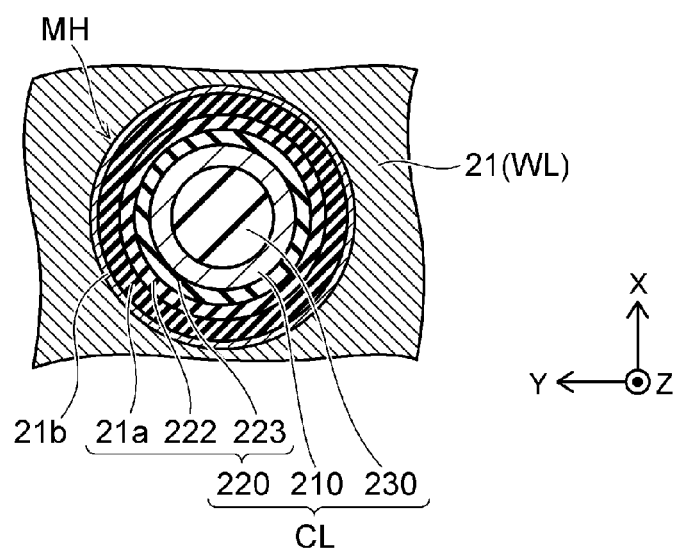
Figure 6:
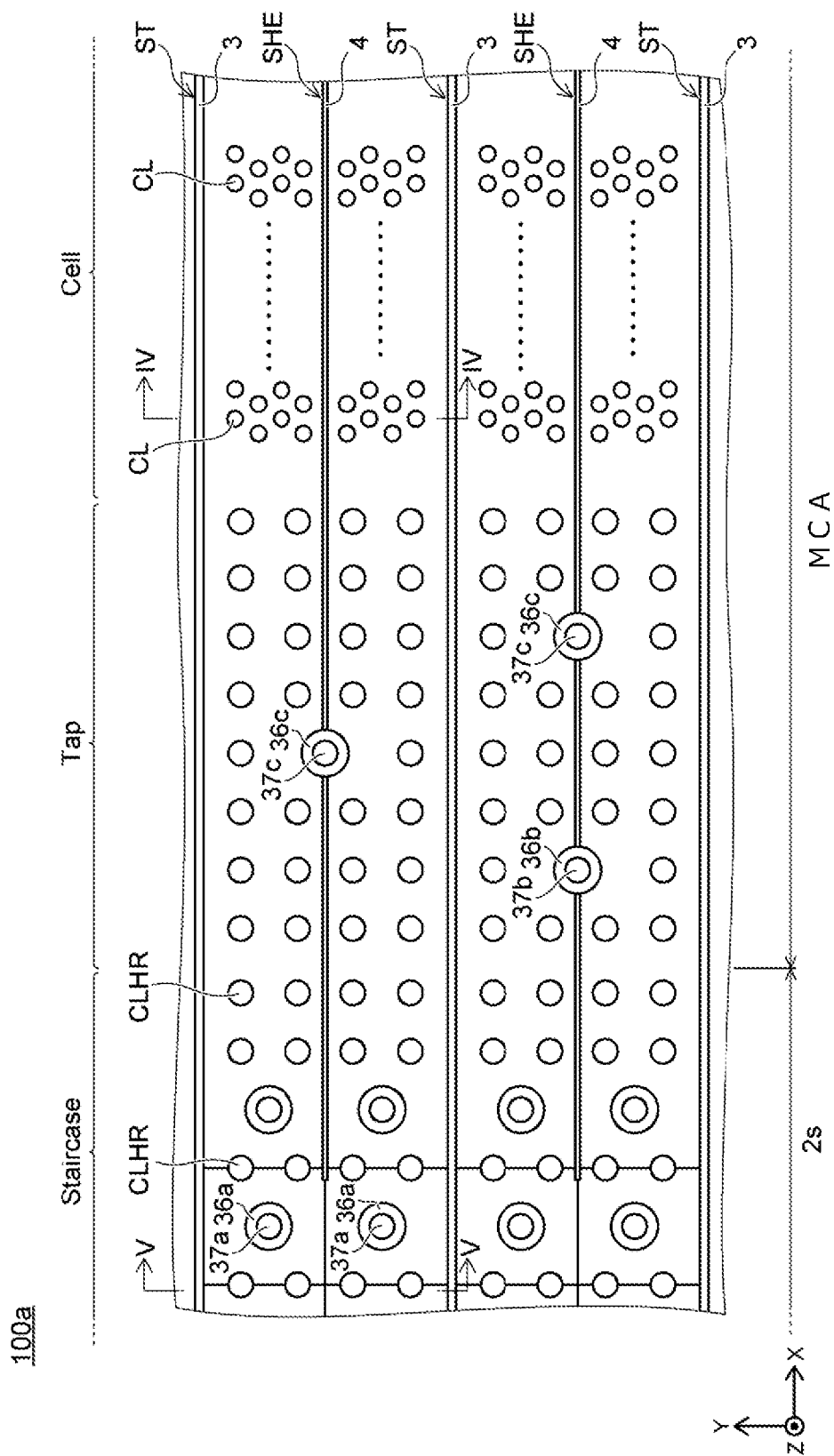
FIG. 6 is a plan view illustrating an example of the semiconductor device according to the first embodiment.

FIG. 2 is a perspective view illustrating an example of a semiconductor device 100a according to the first embodiment. FIG. 3 is a plan view illustrating a stacked body 2. In the present specification, the stacking direction of the stacked body 2 is assumed as a Z-axis direction. One of directions orthogonal to the Z-axis direction is assumed as a Y-axis direction. A direction orthogonal to the Z- and Y-axis directions is assumed as an X-axis direction. FIGS. 4 and 5 are sectional views illustrating an example of memory cells with a three-dimensional structure. FIG. 6 is a plan view illustrating an example of the semiconductor device 100a according to the first embodiment. As illustrated in FIGS. 2 to 6, the semiconductor device 100a according to the first embodiment is a non-volatile memory having a memory cell array with a three-dimensional structure. While being the structure provided in each of the chip regions Rc, the semiconductor device 100a may be provided in the test pattern TEG to be interpreted as the test structure.

The semiconductor device 100a as the chip structure includes a base portion 1, the stacked body 2, a plate-like portion 3, a plurality of columnar portions CL, and a plurality of columnar portions CLHR.

The base portion 1 includes the semiconductor wafer (substrate) 10, an insulating film 11, a conductive film 12, and a semiconductor portion 13. The insulating film 11 is located on the semiconductor wafer 10. The conductive film 12 is located on the insulating film 11. The semiconductor portion 13 is located on the conductive film 12. The semiconductor wafer 10 is, for example, a silicon wafer. The conductivity type of the semiconductor wafer 10 is, for example, a p type. For example, element isolation regions 10i are provided in the surface region of the semiconductor wafer 10. The element isolation regions 10i are, for example, insulating regions including a silicon dioxide film and define active areas AA in the surface region of the semiconductor wafer 10. Source and drain regions of transistors Tr are provided in the active areas AA. The transistors Tr constitute CMOS (Complementary Metal Oxide Semiconductor) circuits as control circuits (first integrated circuits) for the non-volatile memory. The insulating film 11 includes, for example, a silicon dioxide film and insulates the transistors Tr. Wirings 11a are provided in the insulating film 11. The wirings 11a are electrically connected to the transistors Tr. The conductive film 12 includes a conducting metal, for example, tungsten (W). The semiconductor portion 13 includes, for example, n-type silicon. A part of the semiconductor portion 13 may include undoped silicon.

The stacked body 2 as a first stacked body is positioned above the semiconductor portion 13 in the Z-axis direction. The stacked body 2 is configured by alternately stacking a plurality of conductive layers 21 as a plurality of second layers and a plurality of insulating layers 22 as a plurality of first layers. The conductive layers 21 include a conducting metal, for example, tungsten. The insulating layers 22 include, for example, a silicon oxide. The insulating layers 22 insulate the conductive layers 21 from each other. The respective stacking numbers of the conductive layers 21 and the insulating layers 22 may be freely selected. The insulating layers 22 may be, for example, gaps. For example, an insulating film 2g is provided between the stacked body 2 and the semiconductor portion 13. The insulating film 2g includes, for example, a silicon dioxide film. The insulating film 2g may include a high dielectric material having a higher dielectric constant than that of a silicon oxide. The high dielectric material may be, for example, an oxide such as a hafnium oxide film.

The conductive layers 21 include at least one source-side selection gate SGS, a plurality of word lines WL, and at least one drain-side selection gate SGD. The source-side selection gate SGS is a gate electrode of a source-side selection transistor STS. The word lines WL are gate electrodes of memory cells MC. The drain-side selection gate SGD is a gate electrode of a drain-side selection transistor STD. The source-side selection gate SGS is provided in a lower region of the stacked body 2. The drain-side selection gate SGD is provided in an upper region of the stacked body 2. The lower region indicates a region of the stacked body 2 on a side near the base portion 1 and the upper region indicates a region of the stacked body 2 on a side far from the base portion 1. The word lines WL are provided between the source-side selection gate SGS and the drain-side selection gate SGD.

The thickness in the Z-axis direction of insulating layers 22 that insulate the source-side selection gate SGS and a word line WL among the insulating layers 22 may be formed, for example, to be larger than the thickness in the Z-axis direction of insulating layers 22 that insulate a word line WL and a word line WL. A cover dielectric film may be provided above a top insulating layer 22 that is farthest from the base portion 1. The cover dielectric film includes, for example, a silicon oxide.

The semiconductor device 100a includes a plurality of memory cells MC connected in series between the source-side selection transistor STS and the drain-side selection transistor STD. A structure in which the source-side selection transistor STS, the memory cells MC, and the drain-side selection transistor STD are connected in series is called "memory string" or "NAND string". Each memory string is connected to, for example, a bit line BL via a contact Cb. The bit lines BL are provided above the stacked body 2 and extend in the Y-axis direction.

A plurality of deep slits ST and a plurality of shallow slits SHE are provided in the stacked body 2 as illustrated in FIG. 3. The slits ST extend in the X-axis direction in a planar layout. The slits ST penetrate through the stacked body 2 from the top end of the stacked body 2 to the base portion 1 and are provided in the stacked body 2 in a cross-section in the Z-axis direction (the stacking direction). The plate-like portion 3 in FIG. 3 is provided in the slits ST. For example, an insulting film such as a silicon dioxide film is used as the plate-like portions 3. Alternately, the plate-like portions 3 may be formed of a conducting metal such as a conductor (for example, tungsten or copper) electrically connected to the semiconductor portion 13, and may be electrically insulated from the stacked body 2 with an insulating film. The slits SHE extend in the X-axis direction substantially parallel to the slits ST in the planar layout. The slits SHE are provided from the top end of the stack body 2 to the middle of the stacked body 2 in a cross-section in the Z-axis direction. For example, an insulator 4 is provided in the slits SHE. For example, an insulating film such as a silicon dioxide film is used as the insulators 4.

The stacked body 2 includes staircase portions 2s and the memory cell array MCA as illustrated in FIG. 3. The staircase portions 2s are provided at edge parts of the stacked body 2. The memory cell array MCA is sandwiched or enclosed by the staircase portions 2s. The slits ST are provided from the staircase portion 2s at one end of the stacked body 2 through the memory cell array MCA to the staircase portion 2s on the other end of the stacked body 2. The slits SHE are provided at least in the memory cell array MCA.

A part of the stacked body 2 sandwiched by two slits ST (the plate-like portions 3) is referred to as "BLOCK". A block constitutes, for example, a minimum unit for data erase operation. The slits SHE (the insulators 4) are respectively provided in the blocks. A part of the stacked body 2 between the slit ST and the slit SHE is referred to as "finger". The drain-side selection gate SGD is divided for each finger. Therefore, one finger in a block can be brought to a selected state by the drain-side selection gate SGD at the time of data write and read operation.

The memory cell array MCA includes cell regions (Cell) and tap regions (Tap) as illustrated in FIG. 6. Each of the staircase portions 2s includes a staircase region (Staircase). A tap region is provided, for example, between a cell region and a staircase region. Although not illustrated in FIG. 6, a tap region may be provided between cell regions. The staircase regions are regions where a plurality of contacts 37a are provided. The tap regions are regions in which contacts 37b and 37c are provided. The contacts 37a to 37c extend, for example, in the Z-axis direction. The contacts 37a are electrically connected to, for example, the conductive layers 21, respectively. The contacts 37b are electrically connected to, for example, the wirings 11a for purposes such as power supply to the transistors Tr. The contacts 37c are electrically connected to, for example, the conductive film 12. For example, a low-resistance metal such as copper or tungsten is used as the contacts 37a to 37c.

Insulating films 36a to 36c are provided around the contacts 37a to 37c, respectively. The insulating films 36a to 36c are provided between the contacts 37a to 37c and the stacked body 2 and electrically insulate the contacts 37a to 37c from the stacked body 2, respectively. Accordingly, the contacts 37a to 37c can electrically connect wirings or the like located above the stacked body 2 to wirings or the like located below the stacked body 2 while being insulated from the stacked body 2. For example, an insulating film such as a silicon dioxide film is used as the insulating films 36a to 36c. The insulating films 36b and the contacts 37b constitute contacts C4 provided in the tap regions.

Each of the columnar portions CL is provided in a memory hole MH provided in the stacked body 2. The memory holes MH penetrate through the stacked body 2 from the top end of the stacked body 2 along the stacking direction (the Z-axis direction) of the stacked body 2 and extend in the stacked body 2 and in the semiconductor portion 13. Each of the columnar portions CL includes a semiconductor body 210, a memory film 220, and a core layer 230 as illustrated in FIGS. 4 and 5. The semiconductor body 210 is electrically connected to the semiconductor portion 13. The memory film 220 has charge storing portions between the semiconductor body 210 and the conductive layers 21. A plurality of the columnar portions CL each selected from each finger are connected in common to one bit line BL via the relevant contacts Cb. The columnar portions CL are provided, for example, in the cell regions (Cell) in FIG. 6.

As illustrated in FIGS. 4 and 5, the shape of the memory holes MH on an X-Y plane is, for example, a circle or an ellipse. Block dielectric films 21a constituting parts of the memory film 220 may be provided between the conductive layers 21 and the insulating layers 22, respectively. The block dielectric films 21a are, for example, silicon dioxide films or metal oxide films. One example of the metal oxide film is an aluminum oxide. Barrier films 21b may be provided between the conductive layers 21 and the insulating layers 22 and between the conductive layers 21 and the memory film 220, respectively. For example, a stacked structure film including a titanium nitride and titanium is selected as the barrier films 21b in a case in which the conductive layers 21 are tungsten. The block dielectric films 21a prevents back tunneling of charges from the conductive layers 21 to the memory film 220. The barrier films 21b enhance adhesion between the conductive layers 21 and the block dielectric films 21a.

The shape of the semiconductor body 210 is, for example, tubular. The semiconductor body 210 includes, for example, silicon. Silicon is, for example, polysilicon obtained by crystallizing amorphous silicon. The semiconductor body 210 is, for example, undoped silicon. The semiconductor body 210 may be p-type silicon. The semiconductor body 210 serves as respective channels for the drain-side selection transistor STD, the memory cells MC, and the source-side selection transistor STS.

Parts of the memory film 220 other than the block dielectric films 21a are provided between the inner wall of the relevant memory hole MH and the semiconductor body 210. The shape of the memory film 220 is, for example, tubular. The memory cells MC have storage areas between the semiconductor body 210 and the conductive layers 21 serving as the word lines WL and are stacked in the Z-axis direction. The memory film 220 includes, for example, a cover dielectric film 221, a charge storing film 222, and a tunnel dielectric film 223. The semiconductor body 210, the charge storing film 222, and the tunnel dielectric film 223 extend in the Z-axis direction.

The cover dielectric film 221 is located between the insulating layers 22 and the charge storing film 222. For example, a silicon oxide is used as the cover dielectric film 221. The cover dielectric film 221 protects the charge storing film 222 so as not to be etched when sacrificial films 23 (see FIG. 12) are replaced with the conductive layers 21. The cover dielectric film 221 may be removed from between the conductive layers 21 and the memory film 220 in the replacing process. In this case, for example, the block dielectric film 21a is provided between the conductive layers 21 and the charge storing film 222 as illustrated in FIGS. 4 and 5. When the replacing process is not used to form the conductive layers 21, the cover dielectric film 221 does not need to be provided.

The charge storing film 222 is located between the block dielectric film 21a and the cover dielectric film 221, and the tunnel dielectric film 223. The charge storing film 222 includes, for example, a silicon nitride and has trap sites to trap charges in the film. Parts of the charge storing film 222 sandwiched between the conductive layers 21 serving as the word lines WL and the semiconductor body 210 constitute storage areas of the memory cells MC as charge storing portions. The threshold voltages of the memory cells MC vary according to whether there are charges in the relevant charge storing portions or the amount of charges stored in the charge storing portions. This enables the memory cells MC to retain information.

The tunnel dielectric film 223 is located between the semiconductor body 210 and the charge storing film 222. For example, a silicon oxide or a combination of a silicon oxide and a silicon nitride is used as the tunnel dielectric film 223. The tunnel dielectric film 223 is a potential barrier between the semiconductor body 210 and the charge storing film 222. For example, when electrons are input from the semiconductor body 210 to the charge storing portions (a write operation) and when positive holes are input from the semiconductor body 210 to the charge storing portions (an erase operation), the electrons and the positive holes pass (tunnel) through the potential barrier of the tunnel dielectric film 223.

The core layer 230 fills the inside space of the tubular semiconductor body 210. The shape of the core layer 230 is, for example, columnar. For example, an insulating film such as a silicon dioxide film is used as the core layer 230.

The columnar portions CLHR are respectively provided in holes HR formed in the stacked body 2. The holes HR penetrate through the stacked body 2 from the top end of the stacked body 2 along the Z-axis direction and are provided in the stacked body 2 and in the semiconductor portion 13. For example, an insulator such as a silicon dioxide film is used as the columnar portions CLHR. Each of the columnar portions CLHR may have a same structure as that of the columnar portions CL. The columnar portions CLHR are located in, for example, the staircase regions (Staircase) and the tap regions (Tap). The columnar portions CLHR function as support members to hold voids formed in the staircase regions and the tap regions when the sacrificial films 23 (see FIG. 12) are replaced with the conductive layers 21 (the replacing process).

The semiconductor device 100a further includes a semiconductor portion 14 as illustrated in FIG. 2. The semiconductor portion 14 is located between the stacked body 2 and the semiconductor portion 13. The semiconductor portion 14 is provided between an insulating layer 22 closest to the semiconductor portion 13 among the insulating layers 22 and the insulating film 2g. The conductivity type of the semiconductor portion 14 is, for example, an n type. The semiconductor portion 14 functions as, for example, the source-side selection gate SGS.

Figure 7:
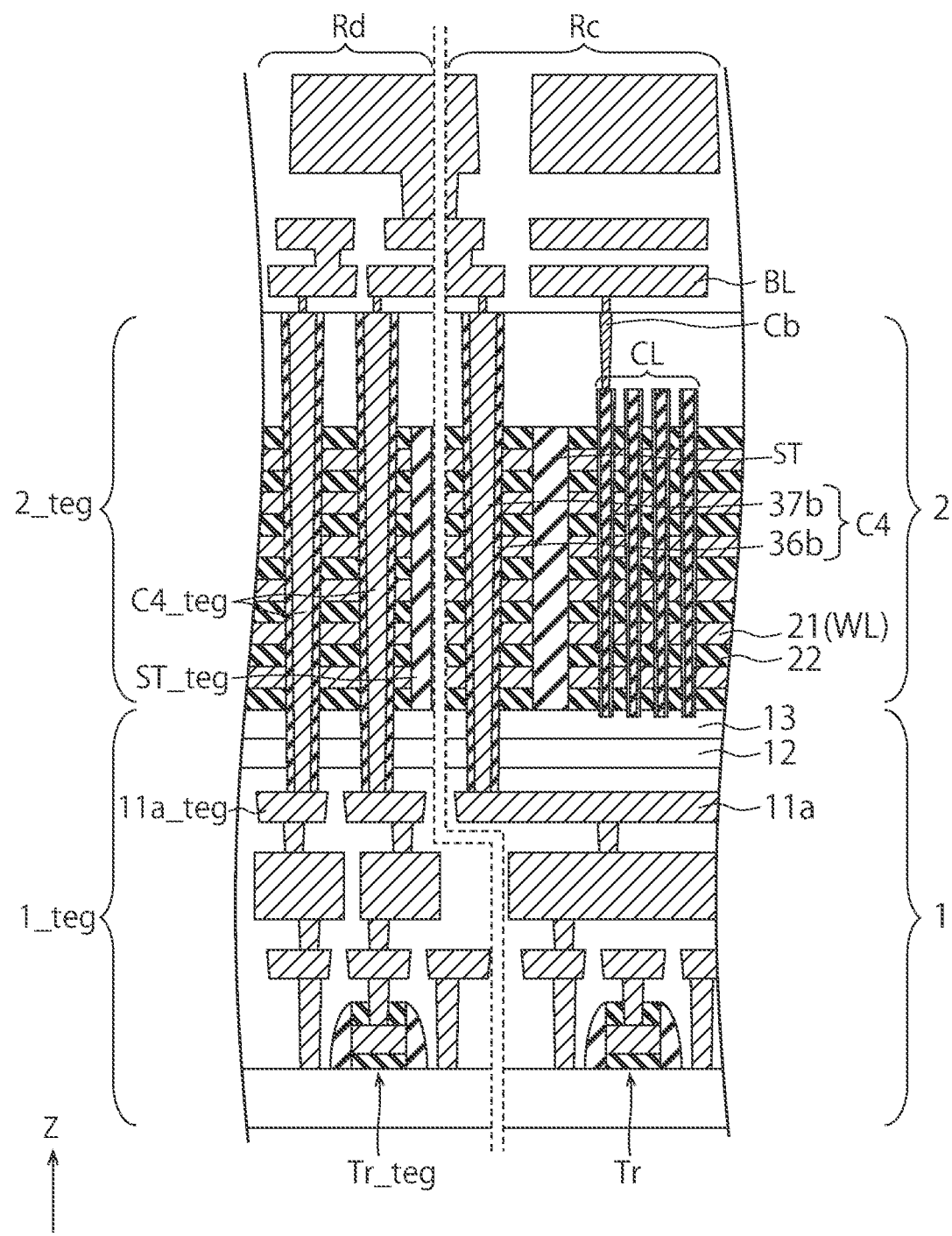
FIG. 7 is a sectional view illustrating an example of the configuration of the chip regions and the dicing regions.

FIG. 7 is a sectional view illustrating an example of the configuration of the chip regions Rc and the dicing regions Rd. For convenience sake, columnar portions CL, a slit ST, and a contact C4 included in the memory cell array MCA are shown side by side in the chip region Rc in FIG. 7. A slit ST_teg and contacts C4_teg included in the test pattern TEG are shown side by side in the dicing region Rd in FIG. 7.

In the chip region Rc, the transistors Tr included in the CMOS circuit are located in the base portion 1. A multi-layer wiring structure including the wirings 11a is located on the transistors Tr. The conductive film 12 and the semiconductor portion 13 are located on the wirings 11a.

As described above, the stacked body 2 is provided above the base portion 1. The columnar portions CL described above extend in the stacked body 2 in the chip regions Rc from above the stacked body 2 to the semiconductor portion 13 in the stacking direction (the Z-axis direction) of the conductive layers 21 and the insulating layers 22. The semiconductor bodies 210 (FIG. 4) of a plurality of the columnar portions CL in a same finger are electrically connected to different bit lines BL via contacts Cb, respectively. Accordingly, when one word line WL is selected, data in a finger selected by the drain-side selection gate SGD is read via the relevant bit lines BL. Alternatively, data is written into memory cells MC in the selected finger via the relevant bit lines BL.

The slits ST penetrate through the stacked body 2 from the top end of the stacked body 2 to the base portion 1 and are provided in the stacked body 2.

The contacts C4 being first contacts extend in the stacked body 2 in the stacking direction of the stacked body 2 and penetrate through the stacked body 2, the semiconductor portion 13, and the conductive film 12 from above the stacked body 2 to the wirings 11a of the base portion 1. The contacts C4 electrically connect a power-supply wiring located above the stacked body 2 to the wirings 11a and are electrically connected to the CMOS circuit including the transistors Tr via the wirings 11a. For example, the contacts C4 can be power-supply contacts provided to supply power to the CMOS circuit. Each of the contacts C4 is constituted of the contact 37b and the insulating film 36b as described above. The insulating film 36b is located between the conductive layers 21 and the contact 37b in the stacked body 2 and covers the circumference of the contact 37b. Due to covering of the circumference of the contact 37b with the insulating film 36b, wirings and the like located above the stacked body 2 can be electrically connected to the wirings 11a and the like located below the stacked body 2 while the contact 37b is insulated from the stacked body 2.

Transistors Tr_teg included in the test pattern TEG as second integrated circuits are provided in a base portion 1_teg in the dicing regions Rd. The transistors Tr_teg constitute a part of a CMOS circuit of the test pattern TEG. A multi-layer wiring structure including wirings 11a_teg is provided on the transistors Tr_teg. The conductive film 12 and the semiconductor portion 13 are provided on the wirings 11a_teg.

A stacked body 2_teg as a second stacked body is provided above the base portion 1_teg. The stacked body 2_teg has the same configuration as that of the stacked body 2. That is, the stacked body 2_teg is provided above the transistors Tr_teg and is configured by alternately stacking a plurality of the insulating layers 22 and a plurality of the conductive layers 21. Slits ST_teg and contacts C4_teg are provided in the stacked body 2_teg.

The slits ST_teg have the same configuration as that of the slits ST. That is, the slits ST_teg penetrate through the stacked body 2_teg from the top end of the stacked body 2_teg to the base portion 1_teg in the dicing regions Rd and are provided in the stacked body 2_teg. For example, an insulating film such as a silicon dioxide film is embedded into the slits ST_teg.

The contacts C4_teg being second contacts extend in the stacking direction of the stacked body 2_teg in the dicing regions Rd and penetrate through the stacked body 2_teg, the semiconductor portion 13, and the conductive film 12 from above the stacked body 2_teg to the wirings 11a_teg of the base portion 1_teg. The contacts C4_teg are provided, for example, to electrically connect a power-supply wiring located above the stacked body 2_teg to the wirings 11a_teg and to supply power to the CMOS circuit including the transistors Tr_teg. The contacts C4_teg have the same configuration as that of the contacts C4. That is, each of the contacts C4_teg is constituted of the contact 37b and the insulating film 36b covering the circumference of the contact 37b. Accordingly, the contacts C4_teg can electrically connect wirings located above the stacked body 2_teg to the wirings 11a_teg located below the stacked body 2_teg while the contact 37b is insulated from the stacked body 2_teg.

According to the present embodiment, the stacked body 2_teg is also provided in the test pattern TEG in the dicing regions Rd as illustrated in FIG. 7. The stacked body 2_teg has the same configuration as that of the stacked body 2 in the chip regions Rc and is provided around the contacts C4_teg having a same configuration as that of the contacts C4. Therefore, the transistors Tr_teg of the test pattern TEG can be tested in a substantially same environment as that of the transistors Tr in the chip regions Rc. Accordingly, due to measuring of the transistors Tr_teg, characteristics of the transistors Tr located below the stacked body 2 (the memory cell array MCA) can be detected. As a result, the effect of the stacked body 2 on the transistors Tr can be detected.

Figure 8A:
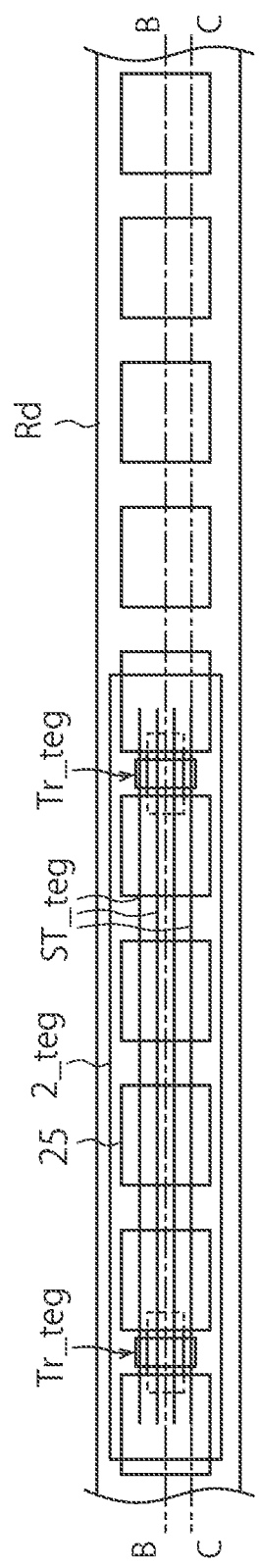
FIG. 8A is a plan view illustrating a configuration example of the dicing regions according to the first embodiment.
Figure 8B:
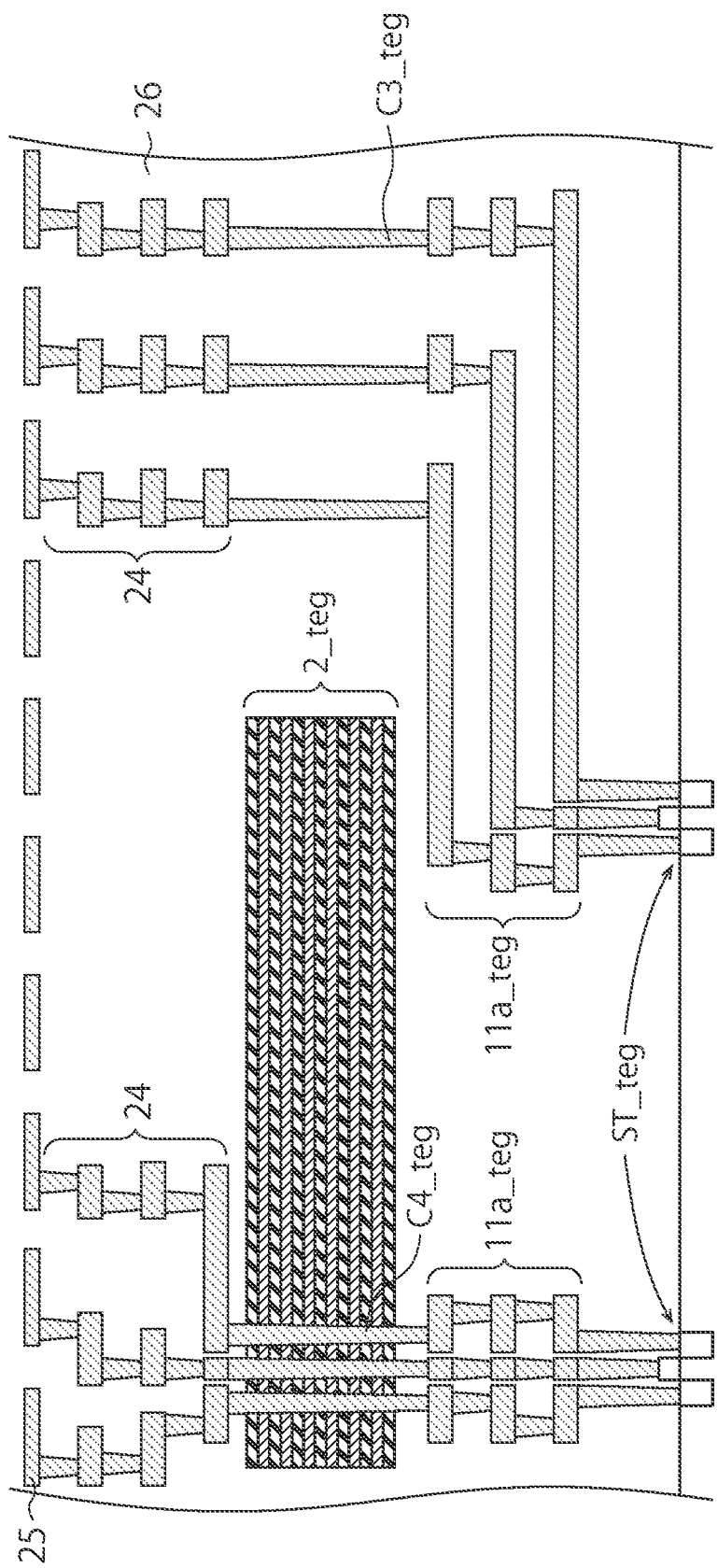
FIG. 8B is a sectional view along a line B-B in FIG. 8A.
Figure 8C:
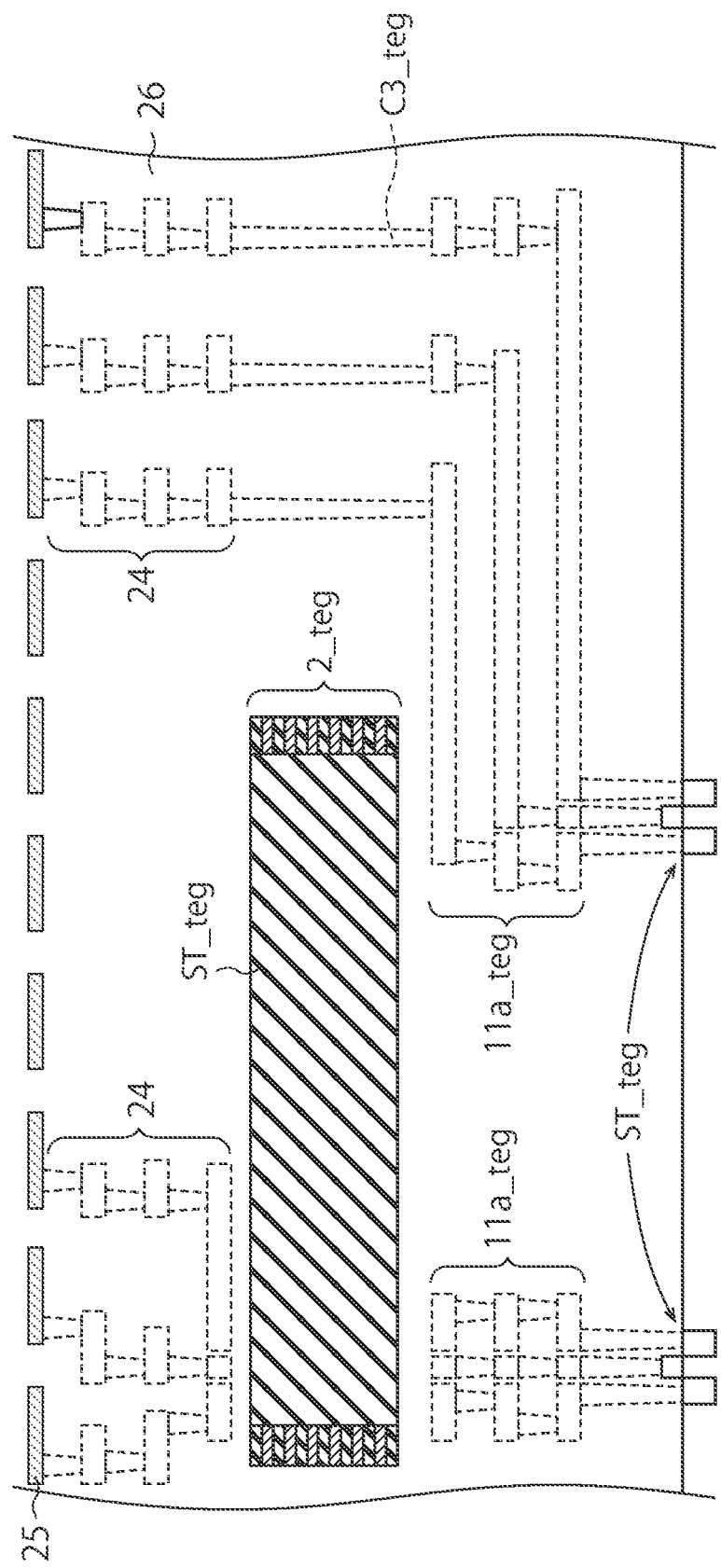
FIG. 8C is a sectional view along a line C-C in FIG. 8A.

FIG. 8A is a plan view illustrating a configuration example of the dicing regions Rd according to the first embodiment. FIG. 8B is a sectional view along a line B-B in FIG. 8A. FIG. 8C is a sectional view along a line C-C in FIG. 8A. As illustrated in FIG. 1, the test patterns TEG are provided in parts of the dicing regions Rd. FIGS. 8A and 8B illustrate a dicing region Rd in which the test pattern TEG is provided.

As illustrated in FIG. 8A, the transistors Tr_teg of the test pattern TEG are provided in the dicing region Rd. While only two transistors Tr_teg are illustrated in FIG. 8A, more transistors Tr_teg may be provided to constitute a CMOS circuit. The stacked body 2_teg is provided on the transistors Tr_teg. The slits ST_teg are provided in the stacked body 2_teg along the extending direction of the dicing region Rd. Pads 25 are further provided above the stacked body 2_teg.

As illustrated in FIG. 8B, the wirings 11a_teg are provided on the transistors Tr_teg, and the stacked body 2_teg is provided thereon. The stacked body 2_teg is provided above a part of the test pattern TEG. Wirings 24 of a multi-layer wiring structure are provided on the stacked body 2_teg. The pads 25 are provided on the wirings 24. The contacts C4_teg are provided in the stacked body 2_teg to extend in the stacking direction (the Z-axis direction) of the stacked body 2_teg.

The pads 25 are electrically connected to the contacts C4_teg via the wirings 24. The contacts C4_teg are connected between the wirings 24 and the wirings 11a_teg, and are electrically connected to the pads 25 via the wirings 24 and are electrically connected to the transistors Tr_teg via the wirings 11a_teg. In this way, the contacts C4_teg are electrically connected between the pads 25 and the transistors Tr_teg. This enables a test apparatus (not illustrated) to test the transistors Tr_teg (the CMOS circuit) from the pads 25 through the contacts C4_teg.

Contacts C3_teg illustrated on the right side of FIG. 8B are provided in an interlayer dielectric film 26 without being provided in the stacked body 2_teg. For example, a silicon dioxide film is used as the interlayer dielectric film 26. The contacts C3_teg are connected between the wirings 24 and the wirings 11a_teg similarly to the contacts C4_teg, and are electrically connected to the pads 25 via the wirings 24 and are electrically connected to the transistors Tr_teg via the wirings 11a_teg. In this way, the contacts C3_teg are also electrically connected between the pads 25 and the transistors Tr_teg. Meanwhile, the contacts C3_teg are not provided in the stacked body 2_teg. Therefore, the contacts C3_teg are not influenced by the stacked body 2_teg. The transistors Tr_teg connected to the contacts C3_teg are provided below the stacked body 2_teg. Therefore, the test apparatus can detect the effect of the stacked body 2_teg on the transistors Tr_teg through the contacts C3_teg while the effect of the stacked body 2_teg on the contacts C3_teg is eliminated. With a comparison between a test result through the contacts C4_teg and a test result through the contacts C3_teg, the effects of the stacked body 2_teg on the contacts C3_teg and C4_teg can be clarified. In this way, the test pattern TEG according to the present embodiment enables the effect of the stacked body 2_teg on the transistors Tr_teg and the contacts C4_teg to be detected.

FIG. 8C illustrates a cross-section parallel to that in FIG. 8B and different therefrom and illustrates a cross-section along the slit ST_teg. The slits ST_teg are broadly provided in the stacked body 2_teg. The slits ST_teg penetrate through the stacked body 2_teg from the top end of the stacked body 2_teg to the bottom end thereof and are provided in the stacked body 2_teg. For example, an insulating film such as a silicon dioxide film is embedded in the slits ST_teg similarly to the plate-like portions 3 of the slits ST. The slits ST_teg are used in a replacing process to replace the sacrificial films 23 with the conductive layers 21 in the stacked structure including the insulating layers 22 and the sacrificial films 23, as will be described later. Although not seen under cover of the interlayer dielectric film 26, the wirings 11a and 24, and the like are indicated by broken lines in FIG. 8C.

The semiconductor wafer 10 according to the present embodiment has a test pattern (the stacked body 2_teg and the transistors Tr_teg therebelow) identical to a chip pattern (the memory cell array MCA and the transistors Tr therebelow) in the chip regions Rc, in the test pattern TEG in the dicing regions Rd. The stacked body 2_teg of the test pattern TEG is formed at the same time as the stacked body 2 of the memory cell array MCA and has a structure including the insulating layers 22 and the conductive layers 21 alternately stacked, which are same as those in the stacked body 2 of the memory cell array MCA. The stacking numbers of the insulating layers 22 and the conductive layers 21 in the stacked body 2_teg are equal to the stacking numbers of the insulating layers 22 and the conductive layers 21 in the stacked body 2. Accordingly, the semiconductor wafer 10 according to the present embodiment enables the effect of the stacked body 2_teg on the transistors Tr_teg in the test pattern TEG (that is, the effect of the stacked body 2 on the transistors Tr) to be accurately detected.

With the slits ST_teg, the sacrificial films 23 of the stacked structure can be replaced with the conductive layers 21 in the test pattern TEG. Therefore, the slits ST_teg enables formation of the stacked body 2_teg also in the test pattern TEG.

A manufacturing method of the semiconductor wafer 10 according to the first embodiment is explained next.

Figure 9A:
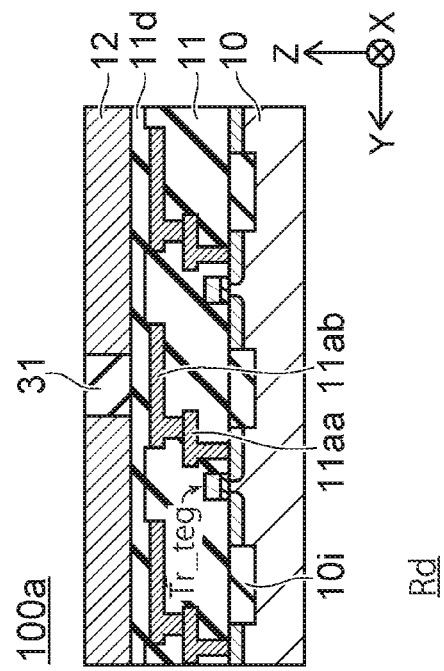

FIGS. 9A to 20B are sectional views illustrating an example of the manufacturing method of the semiconductor wafer 10 according to the first embodiment. FIGS. 9A, 10A, . . . , and 20A illustrate sectional views of the chip regions Rc and FIGS. 9B, 10B, . . . , and 20B illustrate sectional views of the dicing regions Rd.

Figure 9B:
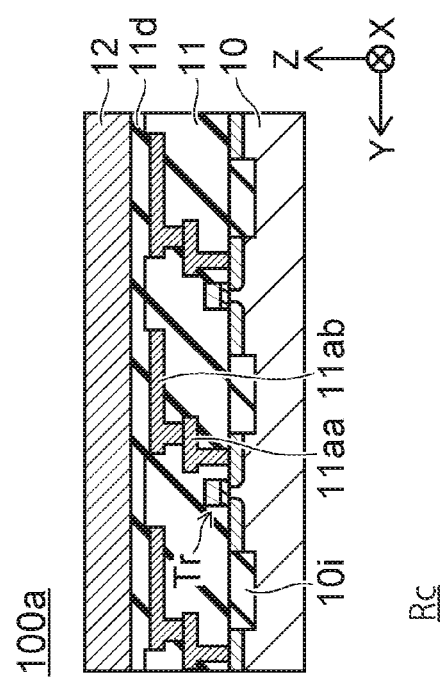

As illustrated in FIGS. 9A and 9B, element isolation regions 10i are formed on the surface of the semiconductor wafer 10 and the transistors Tr and Tr_teg are formed within active areas AA of the chip regions Rc and the dicing regions Rd, respectively. Accordingly, CMOS circuits as first integrated circuits are formed on a plurality of chip regions Rc on the surface of the semiconductor wafer 10. Associated therewith, CMOS circuits as second integrated circuits are formed in the dicing regions Rd between adjacent ones of the chip regions Rc.

Next, the insulating film 11 is formed on the surface of the semiconductor wafer 10. The insulating film 11 is, for example, an interlayer dielectric film and includes the wirings 11a. The wirings 11a are, for example, multi-layer wirings, and wirings 11aa and wirings 11ab provided above the wirings 11aa are illustrated as examples in FIGS. 9A and 9B. Next, an insulating film 11d is formed on the wirings 11ab. For example, a silicon dioxide film is used as the insulating film 11d. Next, the conductive film 12 is formed on the insulating film 11d.

Subsequently, the conductive film 12 is processed into a predetermined pattern using a lithography technique and an etching technique. The conductive film 12 is removed from a region in which the contacts C4_teg are to be formed. An insulator is embedded into portions from which the conductive film 12 has been removed, to form an insulating film 31. For example, a silicon oxide is used as the insulating film 31.

Figure 10B:
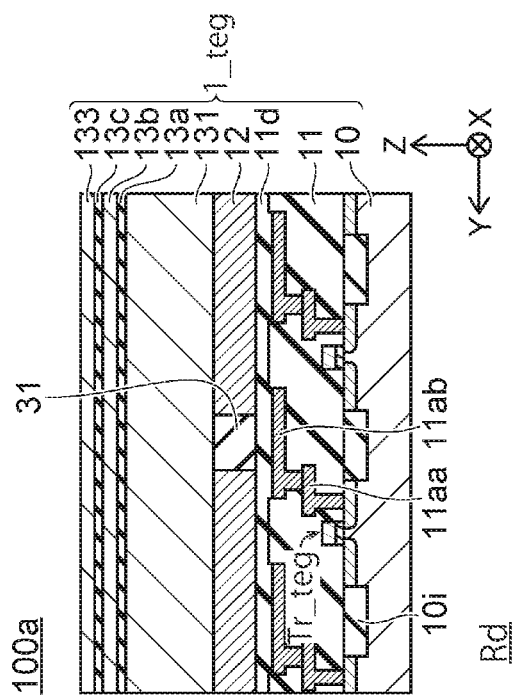
Figure 10A:
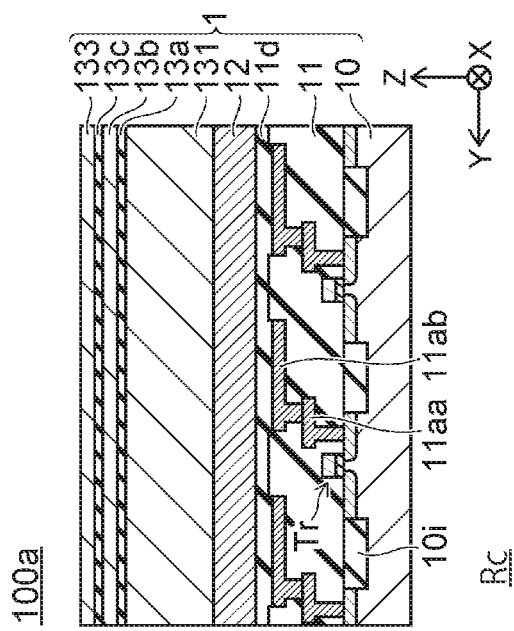

Next, as illustrated in FIGS. 10A and 10B, a semiconductor layer 131 is formed on the conductive film 12 and the insulating film 31. For example, n-type doped silicon is used as the semiconductor layer 131. An intermediate film 13a is formed on the semiconductor layer 131. For example, a silicon oxide is used as the intermediate film 13a. A sacrificial film 13b is formed on the intermediate film 13a. For example, n-type doped silicon or undoped silicon is used as the sacrificial film 13b. An intermediate film 13c is formed on the sacrificial film 13b. For example, a silicon dioxide film is used as the intermediate film 13c. A semiconductor layer 133 is formed on the intermediate film 13c. For example, n-type doped silicon or undoped silicon is used as the semiconductor layer 133. Accordingly, for example, basic structures of the base portions 1 and 1_teg during manufacturing are obtained.

Figure 11B:
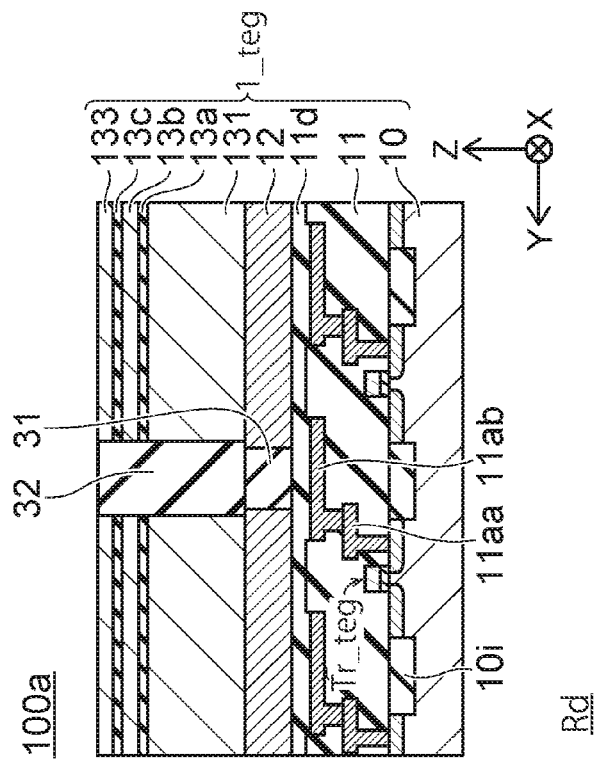
Figure 11A:
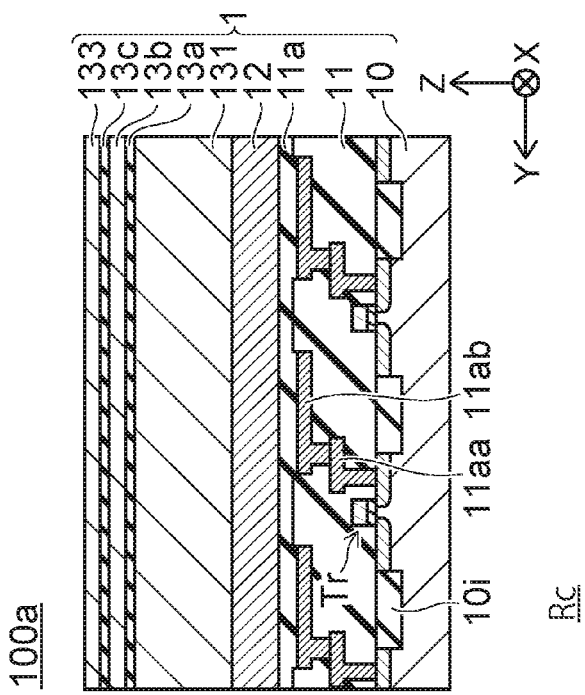

Next, as illustrated in FIGS. 11A and 11B, the semiconductor layer 133, the intermediate film 13c, the sacrificial film 13b, the intermediate film 13a, and the semiconductor layer 131 are processed into a predetermined pattern using a lithography technique and an etching technique. An insulator is embedded into these films to form an insulating film 32. For example, a silicon dioxide film is used as the insulating film 32.

Figure 12B:
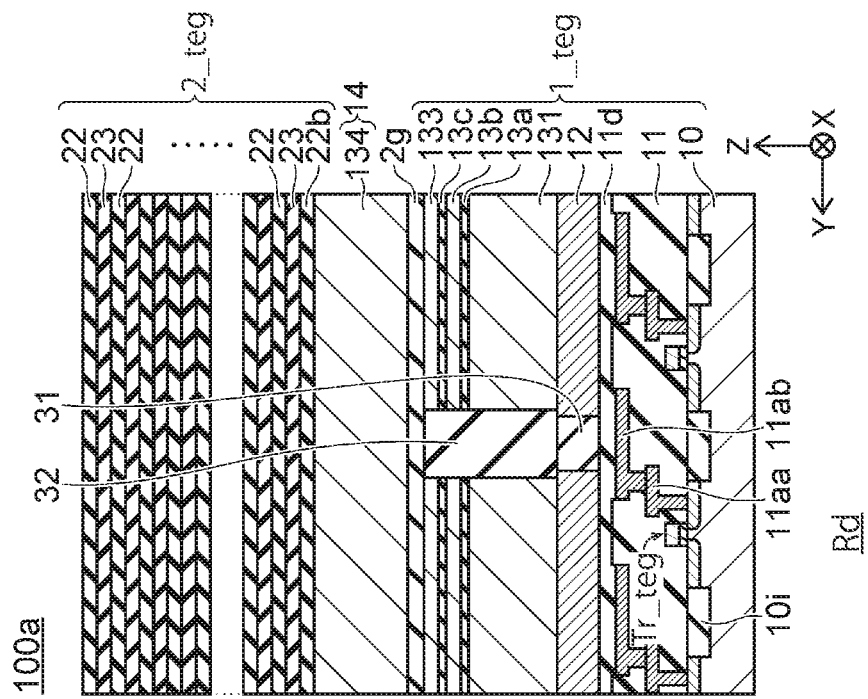
Figure 12A:
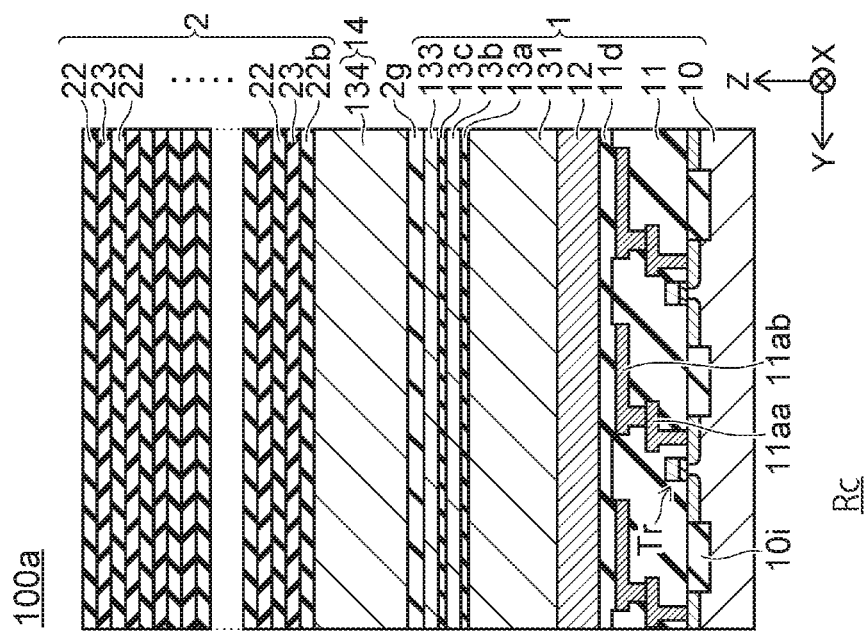

Next, as illustrated in FIGS. 12A and 12B, the insulating film 2g is formed on the semiconductor layer 133 and the insulating film 32. For example, a silicon dioxide film or a metal oxide film is used as the insulating film 2g. Next, a semiconductor layer 134 is formed on the insulating film 2g. For example, n-type doped silicon is used as the semiconductor layer 134. The semiconductor portion 14 is thereby formed. Next, an insulating layer 22b is formed on the semiconductor layer 134. Further, the sacrificial films 23 and the insulating layers 22 are alternately stacked on the insulating layer 22b. For example, a silicon dioxide film is used as the insulating layers 22 and 22b. For example, a silicon nitride film is used as the sacrificial films 23. Accordingly, basic structures of the stacked bodies 2 and 2_teg are formed above the transistors Tr and Tr_teg, respectively.

Subsequently, as illustrated in FIGS. 13A and 13B, the stacked body 2, the semiconductor layer 134, the insulating film 2g, the semiconductor layer 133, the intermediate film 13c, the sacrificial film 13b, the intermediate film 13a, and the semiconductor layer 131 are anisotropically etched in the chip regions Rc to form the memory holes MH. The memory holes MH are formed from the top end of the stacked body 2 to the middle of the semiconductor layer 131.

Next, the semiconductor layer 134, the insulating film 2g, the semiconductor layer 133, the intermediate film 13c, the sacrificial film 13b, the intermediate film 13a, and the semiconductor layer 131 are isotropically etched through the memory holes MH to expand the diameter of the memory holes MH in a portion corresponding to the semiconductor portion 13 (for example, the semiconductor layer 131, the sacrificial film 13b, and the semiconductor layer 133) and a portion corresponding to the semiconductor portion 14 (for example, the semiconductor layer 134).

Next, the memory film 220 is formed in the memory holes MH. A silicon nitride film and a silicon dioxide film are used as the memory film 220. Next, the semiconductor body 210 is formed on the memory film 220. For example, undoped silicon or p-type doped silicon is used as the semiconductor body 210. Subsequently, the core layer 230 is formed on the semiconductor body 210. For example, a silicon dioxide film is used as the core layer 230. Accordingly, the memory holes MH are filled with the semiconductor body 210, the memory film 220, and the core layer 230 as illustrated in FIGS. 13A and 13B. In this way, the columnar portions CL are formed in the stacked body 2. While the columnar portions CL are formed only in the chip regions Rc in the present embodiment, the columnar portions CL may also be formed in the stacked body 2_teg in the dicing regions Rd.

Figure 14B:
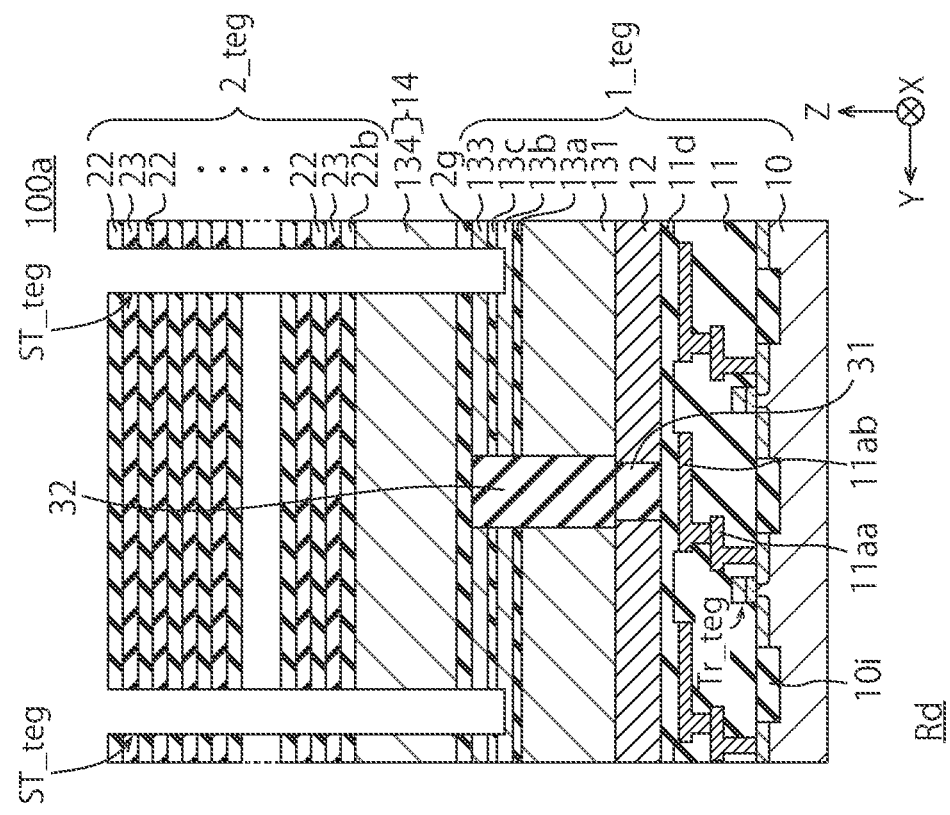
Figure 14A:
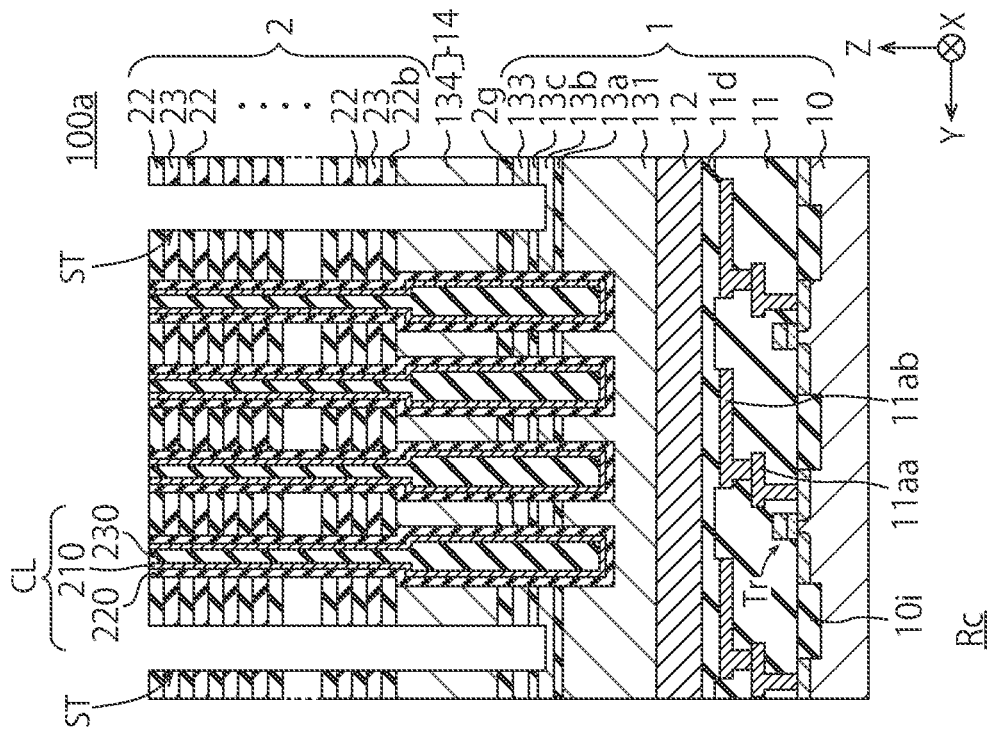

Next, as illustrated in FIGS. 14A and 14B, the stacked bodies 2 and 2_teg, the semiconductor layer 134, the insulating film 2g, the semiconductor layer 133, the intermediate film 13c, and the sacrificial film 13b are anisotropically etched to form the slits ST and ST_teg. The slits ST and ST_teg extend from the top end to the bottom end of the stacked structures of the stacked bodies 2 and 2_teg in the stacking direction (the Z-axis direction) and are formed to the middle of the sacrificial film 13b.

Figures 15A, 15B:
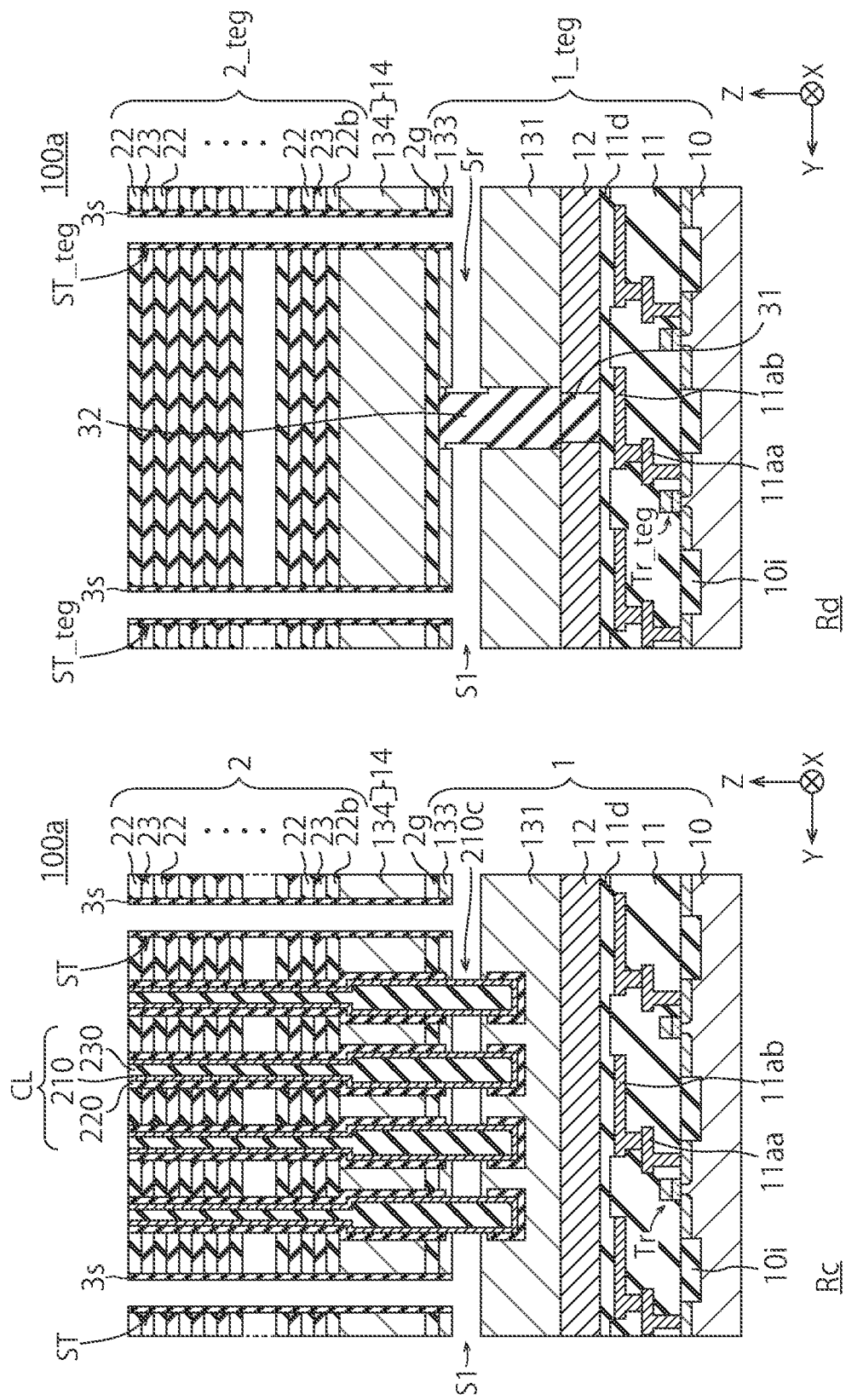

Next, as illustrated in FIGS. 15A and 15B, a stopper film 3s is formed on the side walls of the slits ST and ST_teg. For example, a silicon nitride film is used as the stopper film 3s. Next, the sacrificial film 13b is isotropically etched through the slits ST and ST_teg to remove the sacrificial film 13b. In this isotropic etching process, an etchant that can etch n-typed doped silicon or undoped silicon faster than a silicon oxide and a silicon nitride is selected, for example. Accordingly, spaces 51 are formed between the intermediate film 13a and the intermediate film 13c.

Next, the cover dielectric film 221 (see FIG. 4) of the memory film 220 is isotropically etched through the slits ST and ST_teg to remove the cover dielectric film 221. In this isotropic etching process, an etchant that can etch a silicon oxide faster than a silicon nitride film is selected, for example. Next, the charge storing film 222 (see FIG. 4) of the memory film 220 is isotropically etched through the slits ST and ST_teg to remove the charge storing film 222. In this isotropic etching process, an etchant that can etch a silicon nitride film faster than a silicon dioxide film is selected, for example. Next, the tunnel dielectric film 223 (FIG. 4) of the memory film 220 is removed through the slits ST and ST_teg. In this course, the intermediate film 13a and the intermediate film 13c are also removed. In this isotropic etching process, an etchant that can etch a silicon dioxide film faster than a silicon nitride film is selected, for example. Accordingly, the spaces S1 are expanded between the semiconductor layer 131 and the semiconductor layer 133 and the semiconductor bodies 210 are exposed in the spaces 51 in the columnar portions CL. Parts in which the semiconductor bodies 210 are exposed become contact parts 210c.

Figure 16B:
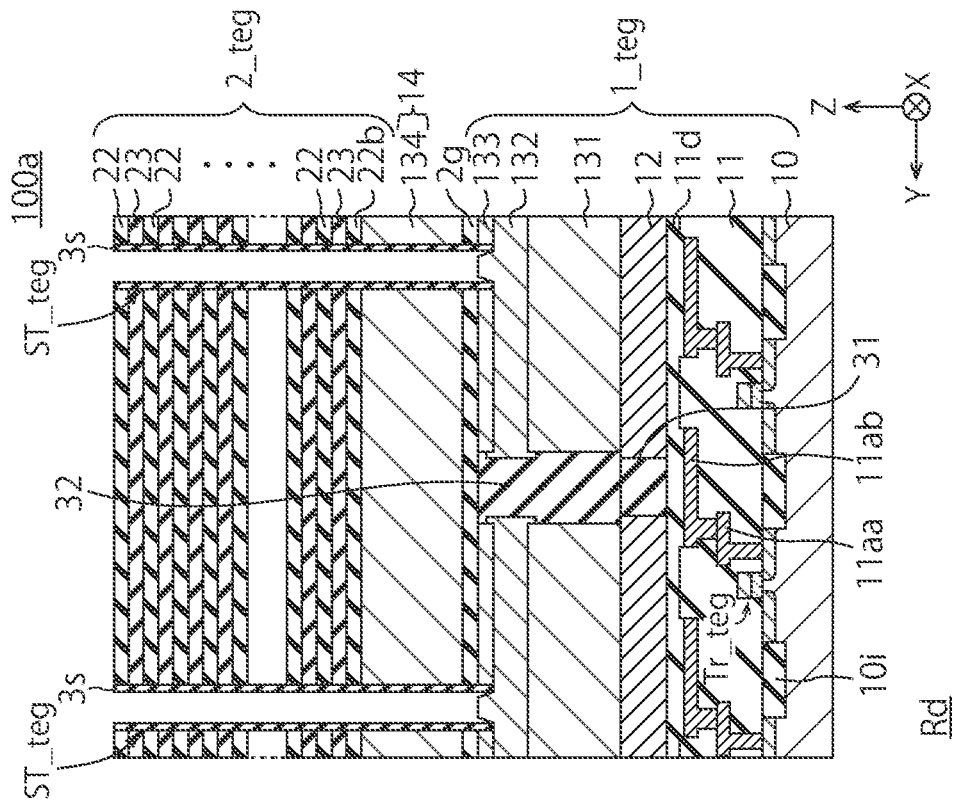
Figure 16A:
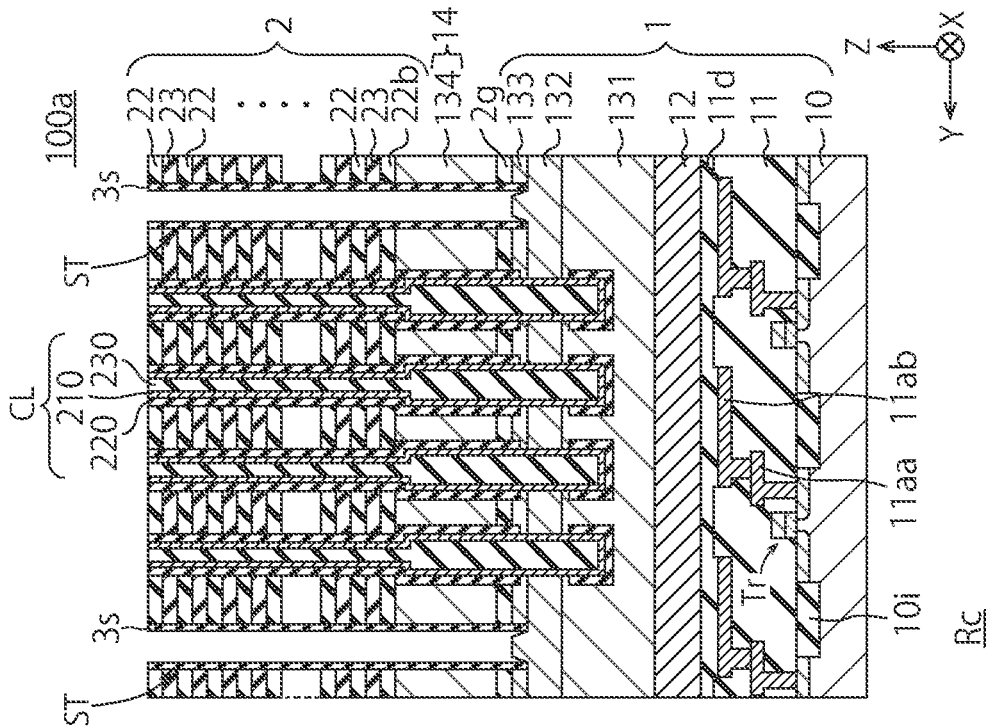

Next, as illustrated in FIGS. 16A and 16B, the spaces 51 are filled with a semiconductor through the slits ST and ST_teg to form the semiconductor layer 132. For example, n-type doped silicon is used as the semiconductor layer 132.

Figures 17A, 17B:
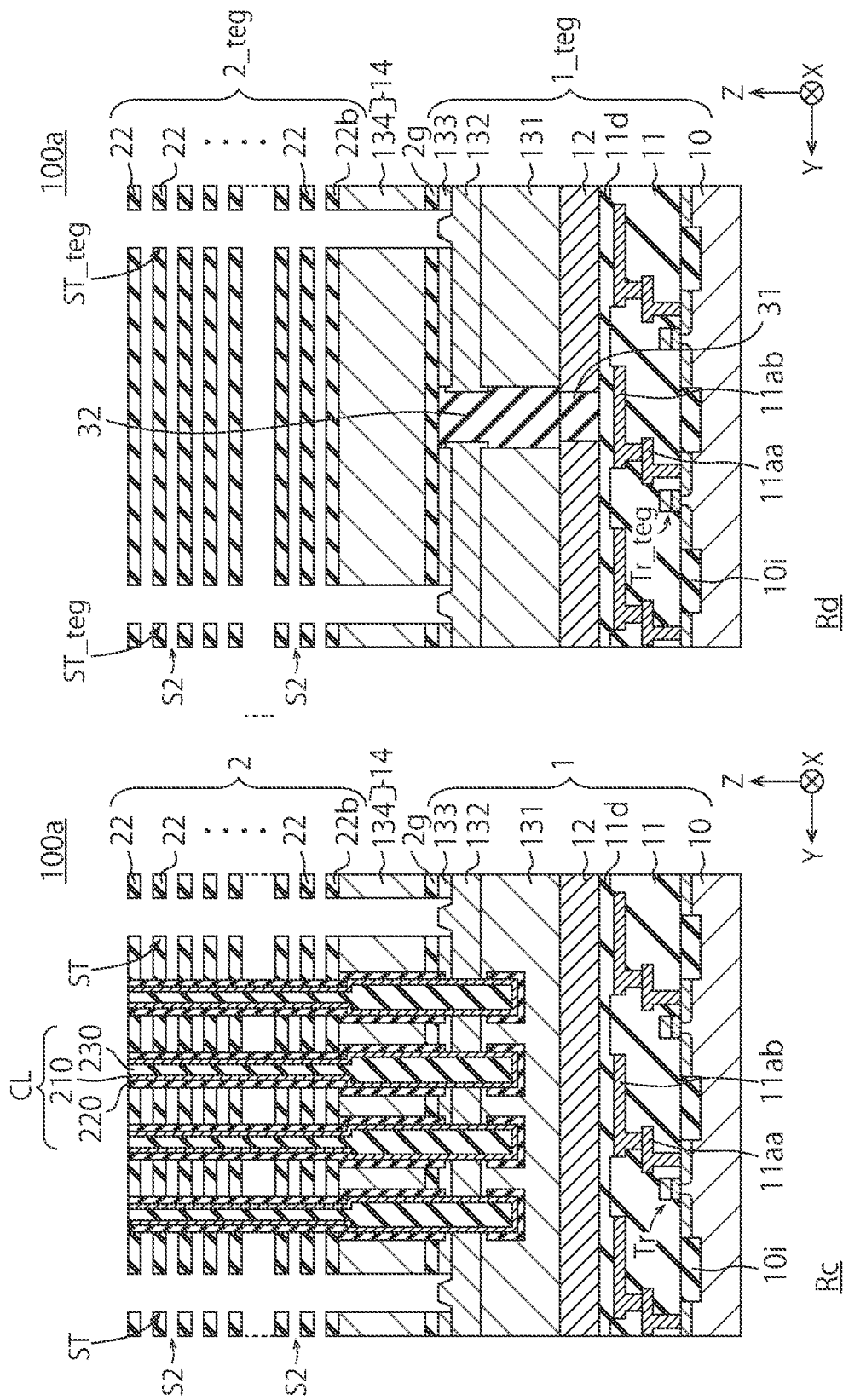

Next, as illustrated in FIGS. 17A and 17B, the stopper film 3s and the sacrificial films 23 are isotropically etched in both the chip regions Rc and the dicing regions Rd through the slits ST and ST_teg to remove the stopper film 3s and the sacrificial films 23. Accordingly, spaces S2 are formed between the insulating layers 22 of the stacked body 2 on the chip regions Rc and the dicing regions Rd. In this isotropic etching process, an etchant that can etch a silicon nitride faster than a silicon dioxide film and polysilicon is used, for example.

Figure 18B:
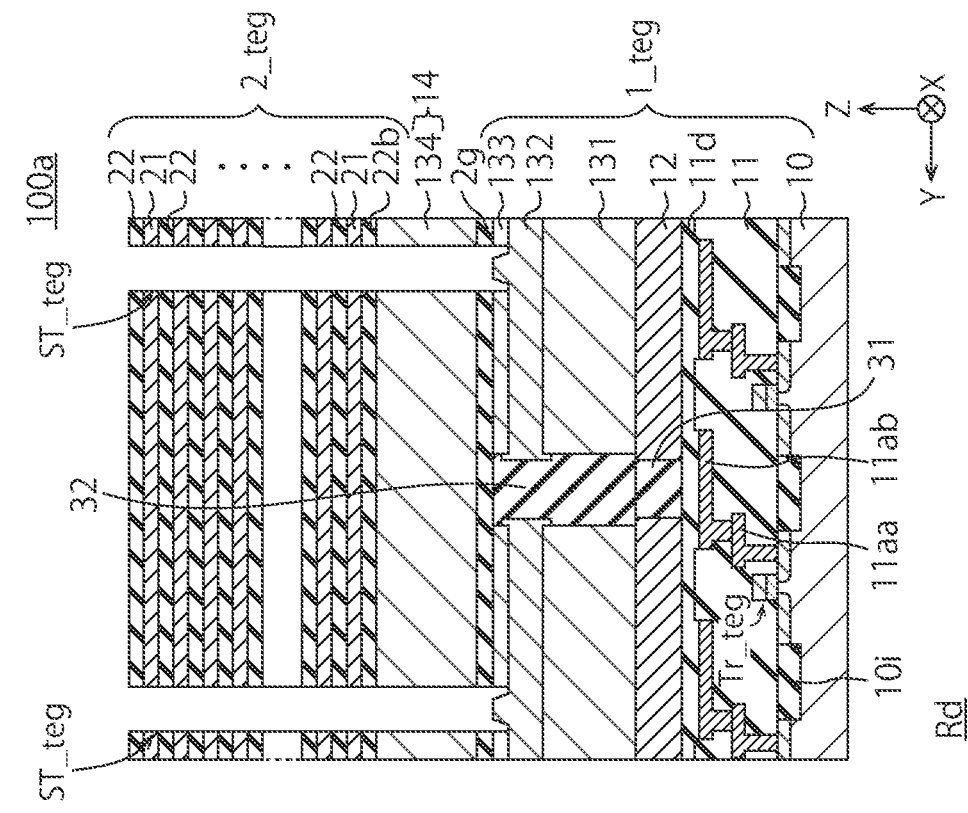
Figure 18A:
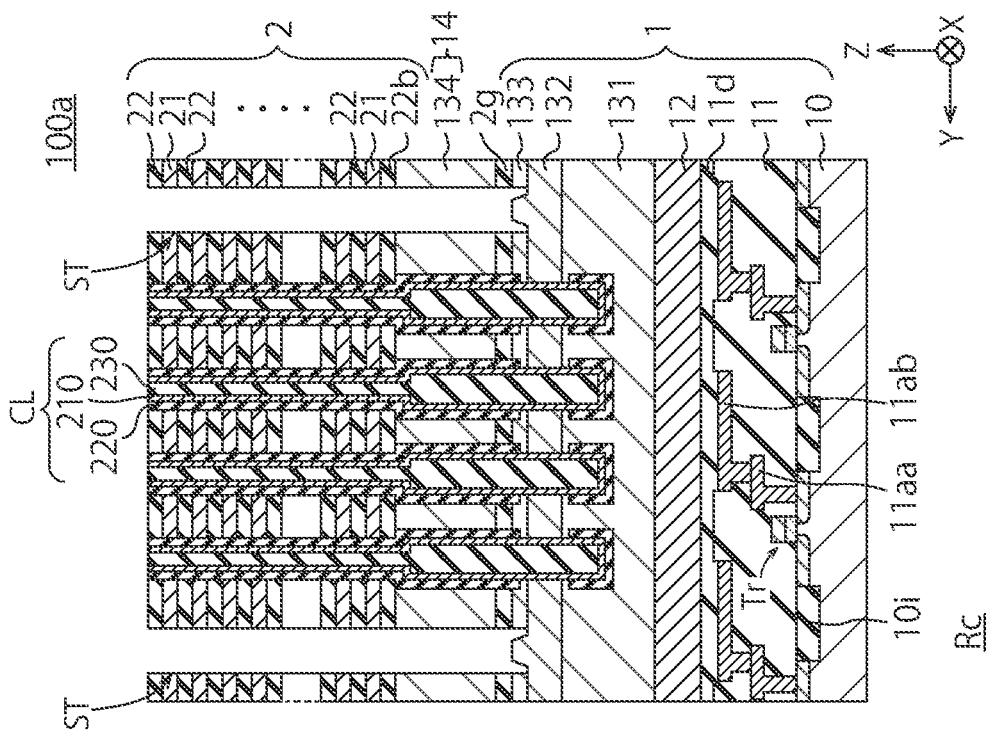

Next, as illustrated in FIGS. 18A and 18B, the spaces S2 from which the sacrificial films 23 have been removed are filled with a conductor to form the conductive layers 21 in the chip regions Rc and the dicing regions Rd through the slits ST and ST_teg. For example, tungsten is used as the conductive layers 21. Accordingly, the stacked body 2 in which the insulating films 22 and the conductive layers 21 are alternately stacked is formed on the chip regions Rc. Also on the dicing regions Rd, the stacked body 2_teg in which the insulating layers 22 and the conductive layers 21 are alternately stacked is formed. In this way, the stacked bodies 2 and 2_teg are formed to have a same configuration of same materials through same processes. In a heat treatment process subsequent to the manufacturing process of the CMOS circuits including the process of replacing the sacrificial films 23 with the conductive layers 21, thermal stress is applied to the CMOS circuits under the stacked bodies 2 and 2_teg. In the present embodiment, this thermal stress is applied also to the CMOS circuits in the test pattern TEG on the dicing regions Rd as well as to the CMOS circuits on the chip regions Rc. Therefore, the CMOS circuits in the test pattern TEG are enabled to have identical characteristics to those of the CMOS circuits on the chip regions Rc.

Next, as illustrated in FIGS. 19A and 19B, the slits ST and ST_teg are filled with an insulator to form the plate-like portions 3. For example, a silicon dioxide film is used as the plate-like portions 3.

Next, as illustrated in FIG. 20A, the conductive layers 21 and the insulating layers 22 are anisotropically etched to the middle of the stacked body 2 to form the shallow slits SHE.

Next, the slits SHE are filled with an insulator to form the insulators 4. For example, a silicon dioxide film is used as the insulators 4.

Next, as illustrated in FIG. 20B, the contacts C4_teg are formed in the stacked body 2_teg in the dicing regions Rd. Each of the contacts C4_teg includes the insulating film 36c and the contact 37c. The contact s 37c are covered by the relevant insulating films 36c and are electrically insulated from the stacked body 2_teg. The contact 37c are electrically connected to the relevant transistor Tr_teg via the wirings 11ab in the wirings 11a, respectively.

Thereafter, a multi-layer wiring structure including the bit lines BL and the like is formed above the stacked body 2 according to a known method although not particularly illustrated. In this way, the semiconductor device 100a according to the first embodiment is manufactured on the semiconductor wafer 10. Thereafter, the dicing regions Rd of the semiconductor wafer 10 are diced with a dicing blade. Accordingly, the chip regions Rc are singulated into individual semiconductor chips. While almost removed by the dicing, the dicing regions Rd sometimes remain on the side surfaces of the semiconductor chips. That is, the semiconductor chips have the test pattern TEG provided in the dicing regions Rd described above on the outer edge portions in some cases.

In these cases, a chip pattern including the base portion 1 and the stacked body 2 (the memory cell array MCA) is provided on the chip region Rc on the surfaces of the semiconductor chips. Meanwhile, a test pattern including the base portion 1_teg and the stacked body 2_teg is provided on the outer edge portions of the semiconductor chips. The chip pattern and the test pattern can respectively be the same as the chip pattern and the test pattern TEG in the first embodiment or a second embodiment.

As described above, according to the present embodiment, a test pattern (the stacked body 2_teg and the transistors Tr_teg thereunder) identical to the chip pattern (the memory cell array MCA and the transistors Tr thereunder) in the chip regions Rc is formed on the test pattern TEG in the dicing regions Rd. The stacked body 2_teg of the test pattern TEG is formed at the same time as the stacked body 2 of the memory cell array MCA and has a structure in which the insulating layers 22 and the conductive layers 21 same as those in the stacked body 2 of the memory cell array MCA are alternately stacked. The stacking numbers of the insulating layers 22 and the conductive layers 21 in the stacked body 2_teg are equal to the stacking numbers of the insulating layers 22 and the conductive layers 21 in the stacked body 2. Accordingly, the effect of the stacked body 2 on the transistors Tr in the chip regions Rc can be more accurately known by detecting the characteristics of the transistors Tr_teg in the test pattern TEG.

Further, provision of the slits ST_teg enables the sacrificial films 23 in the stacked structure to be replaced with the conductive layers 21 also in the test pattern TEG. Therefore, according to the present embodiment, the stacked body 2_teg having the same configuration as that of the stacked body 2 can be formed on the test pattern TEG.

In a case in which the stacked body 2_teg is not provided on the test pattern TEG, a cross-sectional analysis is required to know the effect of the stacked body 2 on the CMOS circuits located thereunder. In contrast thereto, according to the present embodiment, it is unnecessary to cleave a semiconductor chip or a semiconductor wafer to perform a cross-sectional analysis because the stacked body 2_teg is also provided on the test pattern TEG. As a result, the inspection throughput is improved.

Second Embodiment

Figure 21A:
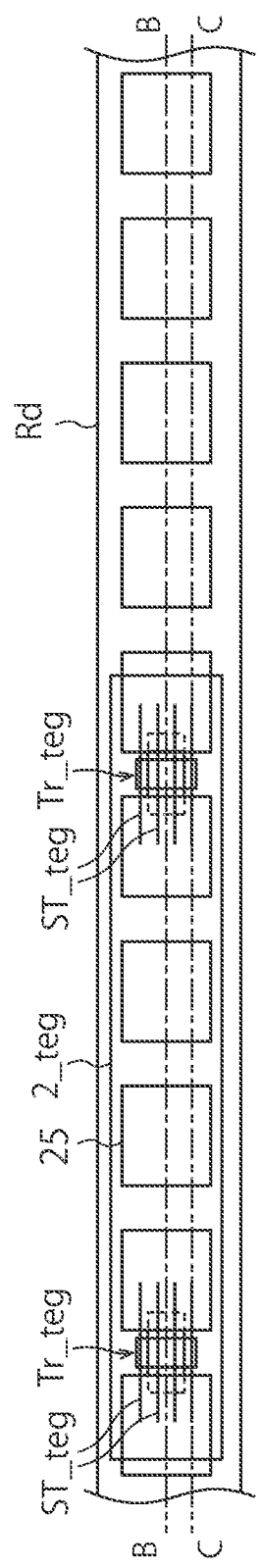
FIG. 21A is a plan view illustrating a configuration example of the dicing region according to a second embodiment.
Figure 21B:
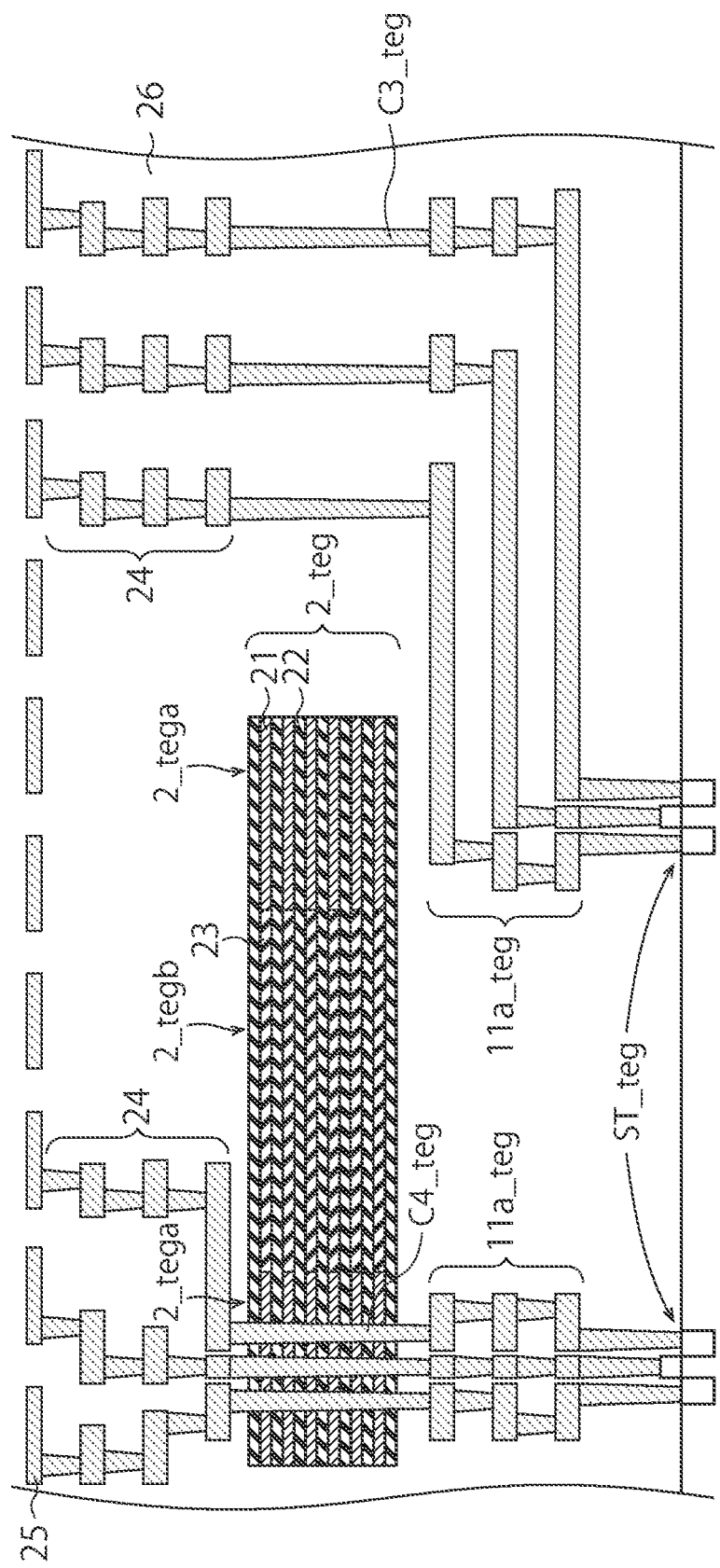
FIG. 21B is a sectional view along a line B-B in FIG. 21A.
Figure 21C:
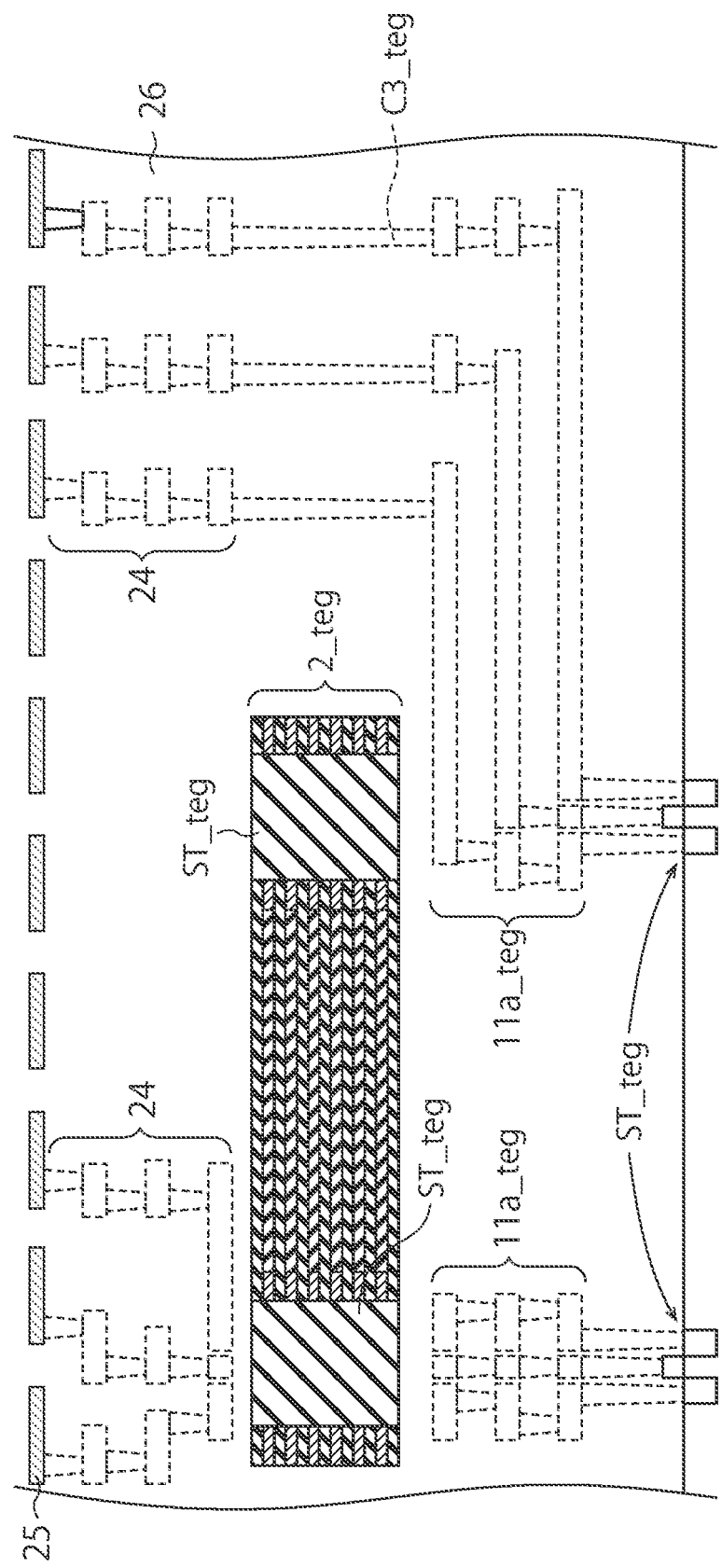
FIG. 21C is a sectional view along a line C-C in FIG. 21A.

FIG. 21A is a plan view illustrating a configuration example of the dicing region Rd according to a second embodiment. FIG. 21B is a sectional view along a line B-B in FIG. 21A. FIG. 21C is a sectional view along a line C-C in FIG. 21A.

In the second embodiment, the slits ST_teg are formed only in parts of the stacked body 2_teg and are not formed in the entire stacked body 2_teg as illustrated in FIGS. 21A and 21C. Therefore, the stacked body 2_teg includes a stacked body portion 2_tega including the conductive layers 21 and the insulating layers 22, and a stacked body portion 2_tegb including the insulating layers 22 and the sacrificial films 23 as illustrated in FIG. 21B. The stacked body portion 2_tegb being a third stacked body has a structure in which the insulating layers (for example, silicon dioxide films) 22 and the sacrificial films 23 made of a material (for example, a silicon nitride film) different from that of the insulating layers 22 are alternately stacked.

The stacked body portion 2_tega is provided around the slits ST_teg. Therefore, with formation of the slits ST_teg on the transistors Tr_teg, the stacked body portion 2_tega is arranged on the transistors Tr_teg. The stacked body portion 2_tegb is provided above a region of the test pattern TEG in which the transistors Tr_teg are not provided. The rest of the configuration in the second embodiment can be identical to a corresponding configuration in the first embodiment.

According to the second embodiment, because the stacked body portion 2_tega including the conductive layers 21 and the insulating layers 22 is provided on the transistors Tr_teg, the effect of the stacked body 2 on the transistor Tr can be detected in the test pattern TEG, similarly in the first embodiment. The second embodiment can also achieve other effects of the first embodiment.

Further, according to the second embodiment, the stacked body 2_teg includes the stacked body portion 2_tega including the conductive layers 21 and the insulating layers 22, and the stacked body portion 2_tegb including the insulating layers 22 and the sacrificial films 23. A metal film such as tungsten is, for example, used as the conductive layers 21 and an insulating film such as a silicon nitride film is, for example, used as the sacrificial films 23. The metal film such as tungsten is harder than the insulating film such as a silicon nitride film and is not easy to dice. Therefore, if the conductive layers 21 are provided entirely in the stacked body 2_teg, the dicing blade is intensely worn in the dicing process and the dicing blade is likely to degrade. In contrast thereto, at least a part of the stacked body 2_teg is constituted of the stacked body portion 2_tegb including the insulating layers 22 and the sacrificial films 23 in the second embodiment. For example, the stacked body portion 2_tegb is located above a part of the dicing region Rd in which the test pattern TEG of the transistor Tr_teg and the like is not provided. This reduces and prevents degradation of the dicing blade in the dicing process.

A manufacturing method according to the second embodiment is basically same as that according to the first embodiment. However, only the layout pattern of the slits ST_teg in the test pattern TEG is different as illustrated in FIG. 21A.

After the processes illustrated in FIG. 9A to 20B have been performed, the dicing regions Rd of the semiconductor wafer 10 are diced with a dicing blade. At that time, a part of the stacked body 2_teg is constituted of the stacked body portion 2_tega and the remaining part is constituted of the stacked body portion 2_tegb. Accordingly, degradation of the dicing blade is prevented in the dicing process.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor wafer including a first face, the wafer comprising:
   a plurality of chip structures provided on a plurality of chip regions of the first face; and
   a test structure provided on dicing regions between adjacent ones of the chip regions, wherein
   the chip structures each comprise a plurality of first transistors provided on the semiconductor wafer, and a first stacked body provided above the plurality of first transistors and including a plurality of first layers and a plurality of second layers different from the first layers alternately stacked,
   a semiconductor body extending in a stacking direction of the first stacked body in the first stacked body,
   a memory film comprising charge storing portions between the second layers and the semiconductor body, and
   a first metal contact extending in a stacking direction of the first stacked body in the first stacked body and electrically connected to one of the plurality of first transistors,
   wherein the test structure comprises a plurality of second transistors provided on the semiconductor wafer, and a second stacked body provided above the plurality of second transistors and including the first layers and the second layers alternately stacked, and
   a second metal contact extending in a stacking direction of the second stacked body in the second stacked body and electrically connected to one of the plurality of second transistors.

2. The wafer according to claim 1, further comprising a slit structure extending in a stacking direction of the second stacked body in the second stacked body.

3. The wafer according to claim 1, wherein the second layers are made of a metallic material.

4. The water according to claim 1, wherein the test structure further comprises a third stacked body provided on the plurality of second transistors and including the plurality of first layers and a plurality of third layers alternately stacked, the plurality of third layers being made of a material different from that of the first layers.

5. The wafer according to claim 4, wherein
   the first layers are silicon dioxide films, and
   the third layers are silicon nitride films.

6. A semiconductor chip including a first face, the chip comprising:
   a chip structure provided on the first face; and
   a test structure provided on an outer edge portion of the semiconductor chip, wherein
   the chip structure comprises a plurality of first transistors provided on the semiconductor wafer, and a first stacked body provided on the plurality of first transistors and including a plurality of first layers and a plurality of second layers alternately stacked,
   a semiconductor body extending in a stacking direction of the first stacked body in the first stacked body,
   a memory film comprising charge storing portions between the second layers and the semiconductor body, and
   a first metal contact extending in a stacking direction of the first stacked body in the first stacked body and electrically connected to one of the plurality of first transistors,
   wherein the test structure comprises a plurality of second transistors provided on the semiconductor wafer, and a second stacked body provided on the plurality of second transistors and including the first layers and the second layers alternately stacked, and
   a second metal contact extending in a stacking direction of the second stacked body in the second stacked body and electrically connected to one of the plurality of second transistors.

7. The semiconductor chip according to claim 6, further comprising a second contact extending in a stacking direction of the second stacked body in the second stacked body and electrically connected to any of the second transistors.

8. The semiconductor chip according to claim 6, further comprising a slit structure extending in a stacking direction of the second stacked body in the second stacked body.

9. The semiconductor chip according to claim 6, wherein the second layers are made of a metallic material.

10. The semiconductor chip according to claim 6, wherein the test structure further comprises a third stacked body provided on the second transistors and including the first layers and a plurality of third layers alternately stacked, the third layers being made of a material different from that of the first layers.

11. The semiconductor chip according to claim 10, wherein
    the first layers are silicon dioxide films, and
    the third layers are silicon nitride films.

* * * * *